United States Patent
Whetsel

(10) Patent No.: US 8,412,853 B2
(45) Date of Patent: Apr. 2, 2013

(54) TWO PIN SERIAL BUS COMMUNICATION INTERFACE

(75) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 913 days.

(21) Appl. No.: 11/258,315

(22) Filed: Oct. 25, 2005

(65) Prior Publication Data

US 2006/0123306 A1 Jun. 8, 2006

Related U.S. Application Data

(60) Provisional application No. 60/622,255, filed on Oct. 25, 2004.

(51) Int. Cl.
*G06F 3/00* (2006.01)
(52) U.S. Cl. .......................................... 710/2
(58) Field of Classification Search .................. None
See application file for complete search history.

(56) References Cited

U.S. PATENT DOCUMENTS

| | | | | |
|---|---|---|---|---|
| 4,591,929 A * | 5/1986 | Newsom | ................. | 360/32 |
| 6,058,252 A * | 5/2000 | Noll et al. | ............... | 716/113 |
| 6,847,335 B1 * | 1/2005 | Chang et al. | ........... | 345/3.1 |
| 6,996,761 B2 * | 2/2006 | Whetsel | ............... | 714/736 |
| 7,058,871 B2 * | 6/2006 | Whetsel | ............... | 714/736 |
| 7,526,691 B1 * | 4/2009 | Jayabharathi et al. | ....... | 714/724 |
| 2002/0162063 A1 * | 10/2002 | Whetsel | ............... | 714/724 |
| 2004/0071028 A1 * | 4/2004 | Messina et al. | ........... | 365/202 |

* cited by examiner

*Primary Examiner* — Henry Tsai
*Assistant Examiner* — Aurangzeb Hassan
(74) *Attorney, Agent, or Firm* — Lawrence J. Bassuk; W. James Brady; Frederick J. Telecky, Jr.

(57) ABSTRACT

A two pin communication interface bus and control circuits are used with circuit boards, integrated circuits, or embedded cores within integrated circuits. One pin carries data bi-directionally and address and instruction information from a controller to a selected port. The other pin carries a clock signal from the controller to a target port or ports in or on the desired circuit or circuits. The bus may be used for serial access to circuits where the availability of pins on ICs or terminals on cores is minimal. The bus is used for communication, such as serial communication related to the functional operation of an IC or core design, or serial communication related to test, emulation, debug, and/or trace operations of an IC or core design.

5 Claims, 27 Drawing Sheets

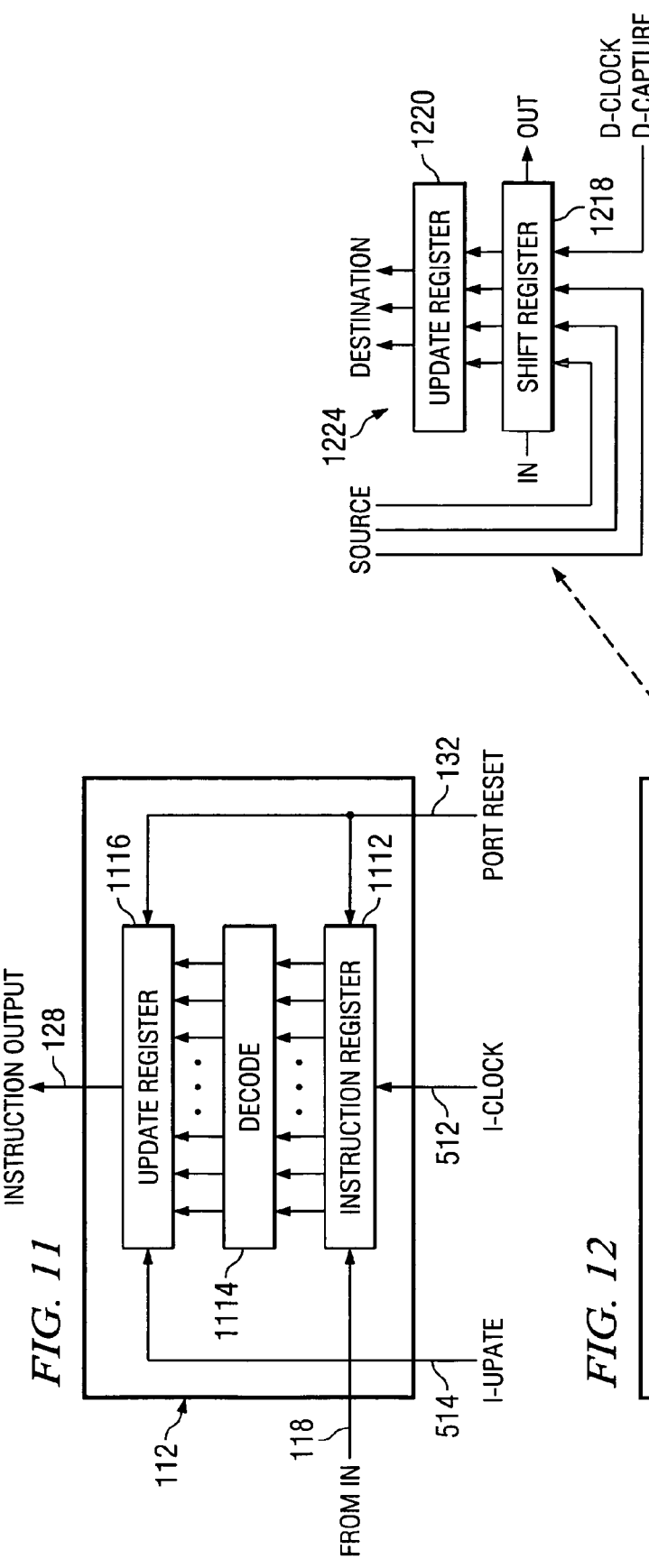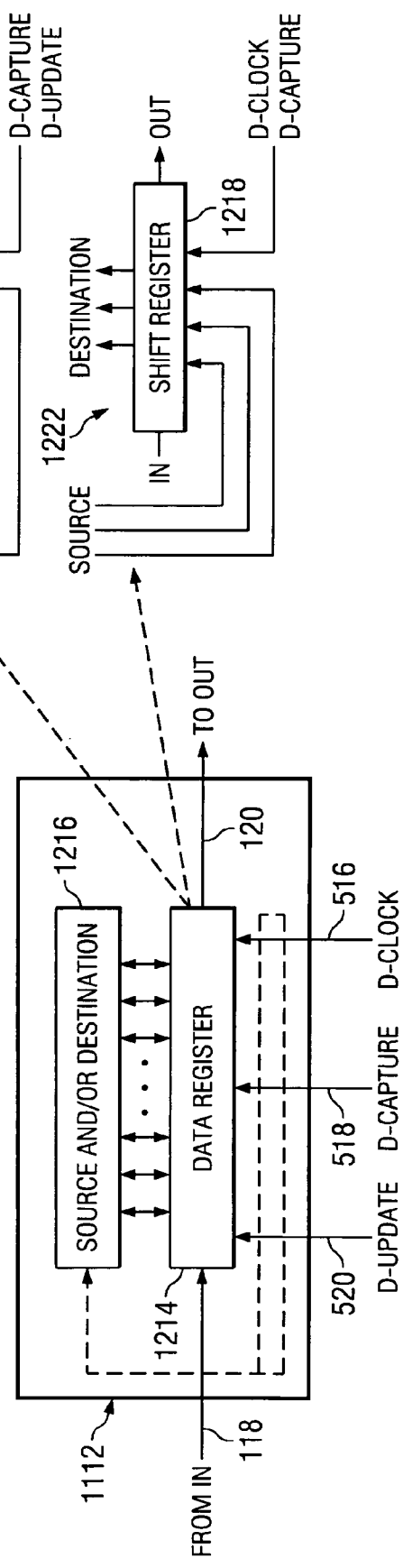
FIG. 11
FIG. 12

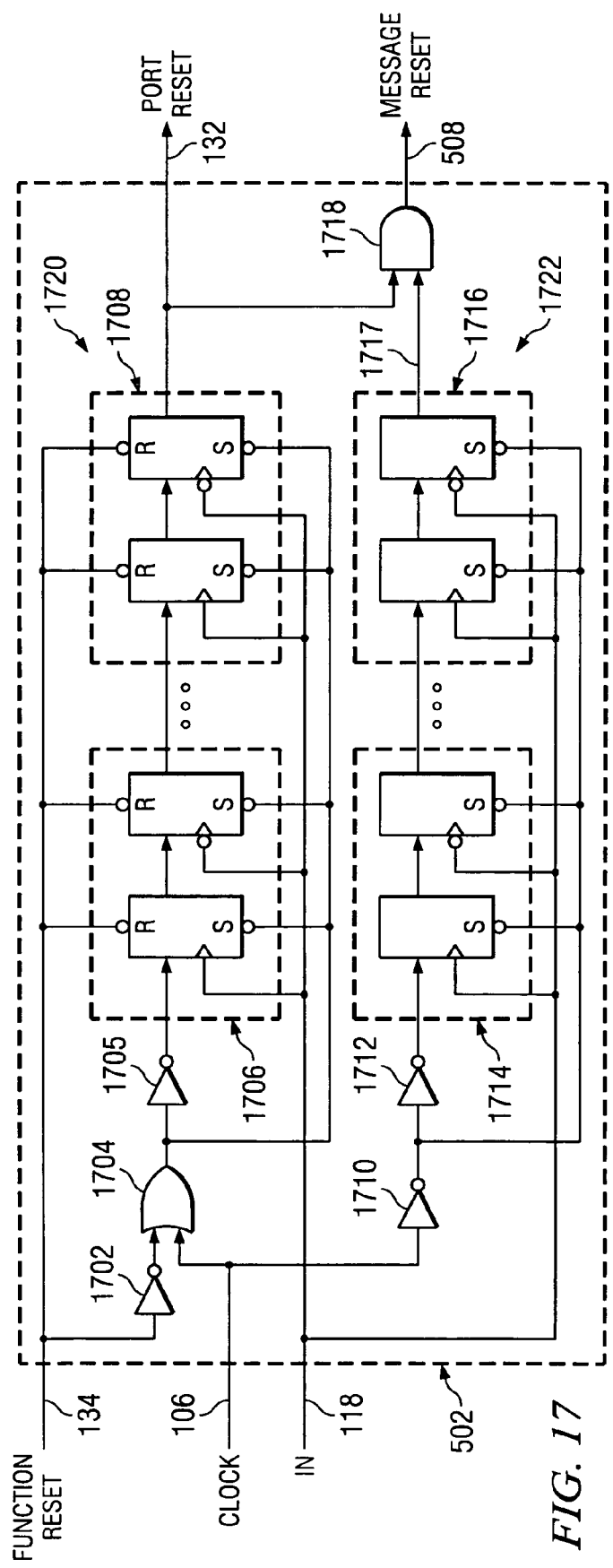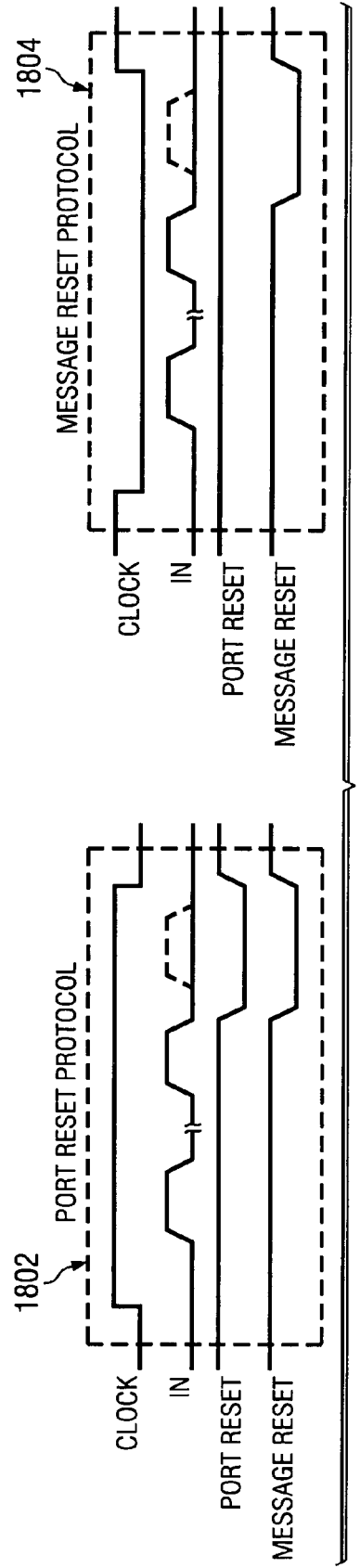
FIG. 17
FIG. 18

TWO PIN SERIAL BUS COMMUNICATION INTERFACE

This application claims the benefit of prior application Ser. No. 60/622,255, filed Oct. 25, 2004.

BACKGROUND OF THE INVENTION

1. Technical Field

This description pertains generally to serial communications and particularly to providing a serial communications interface between a controller and a selected communications port.

2. Brief Description of Related Art

Semiconductor manufacturing test and other operations such as trace, debug, and emulation often use the interface signals defined in IEEE Standard 1149.1, commonly known as JTAG. This interface defines four to five leads used to send and receive serial data to and from a target circuit. This interface is broadly used in the industry today and has been extended beyond its original purpose of boundary scan.

The number of pins available for such serial communication to and from a target circuit is being reduced because of package size reductions that require most of the pins to be used for functional purposes.

Thus a need has arisen for a reduced pin interface to and from a target circuit. While such an interface can be used in semiconductor manufacturing test and other operations such as trace, debug and emulation, such an interface could also be used generally for other types of serial communication.

BRIEF SUMMARY OF THE INVENTION

This disclosure pertains to a communications interface using one wire or pin for data transmission and one wire or pin for a clock signal transmission between the controller and selected data port. This communications interface finds utility in an external controller communicating with internal registers, such as boundary scan, serial scan, test, trace, debug, and functional registers of such as an integrated circuit, core circuits in an integrated circuit, or core circuits within core circuits in an integrated circuit.

The serial data communications circuit comprises a bi-directional external data signal lead and an external clock signal input lead. Data I/O circuitry is connected to the bi-directional external data signal lead and provides an internal input data signal lead and an internal output data signal lead.

Port controller circuitry has an input connected to the external clock signal input lead and has an input connected to the internal input data signal lead to control operation of the port. Instruction circuitry and address circuitry are connected to the internal input data signal lead and to the port controller circuitry to provide control information to the port controller. The port controller circuitry includes a state machine operating in response to the external clock signal and signals from the address circuitry.

Data circuits are connected to the internal input data signal lead and to the port controller circuitry. The data circuits can be one or, more of functional circuits, boundary scan circuits, serial scan circuits, test circuits, trace circuits, debug circuits, and emulation circuits.

The data I/O circuitry includes comparator circuitry determining the logic state of data received on the external bi-directional data signal lead in response to the logic state of data on the internal output data signal lead. The data I/O circuitry also includes multiplexer circuitry to output a data signal on the internal data signal lead in response to the data signal detected on the external bi-directional data signal lead by the comparator circuitry.

A system can include the port circuit and a bus controller connected to the bi-directional external data signal lead and to the external clock signal input lead. The bus controller supplies the clock signal to the serial data communications circuit.

BRIEF DESCRIPTION OF THE DRAWINGS

FIG. 3A illustrates the controller realized by an interface card in a personal computer with a cable connection.

FIG. 11 illustrates an example implementation of the instruction circuit of FIG. 1.

FIG. 12 illustrates in general an example implementation of data circuits within the data circuit block of FIG. 1.

FIG. 17 illustrates an example implementation of the port and message reset controller.

FIG. 18 illustrates a timing diagram.

DESCRIPTION OF THE DISCLOSED EMBODIMENTS

Figure 1:
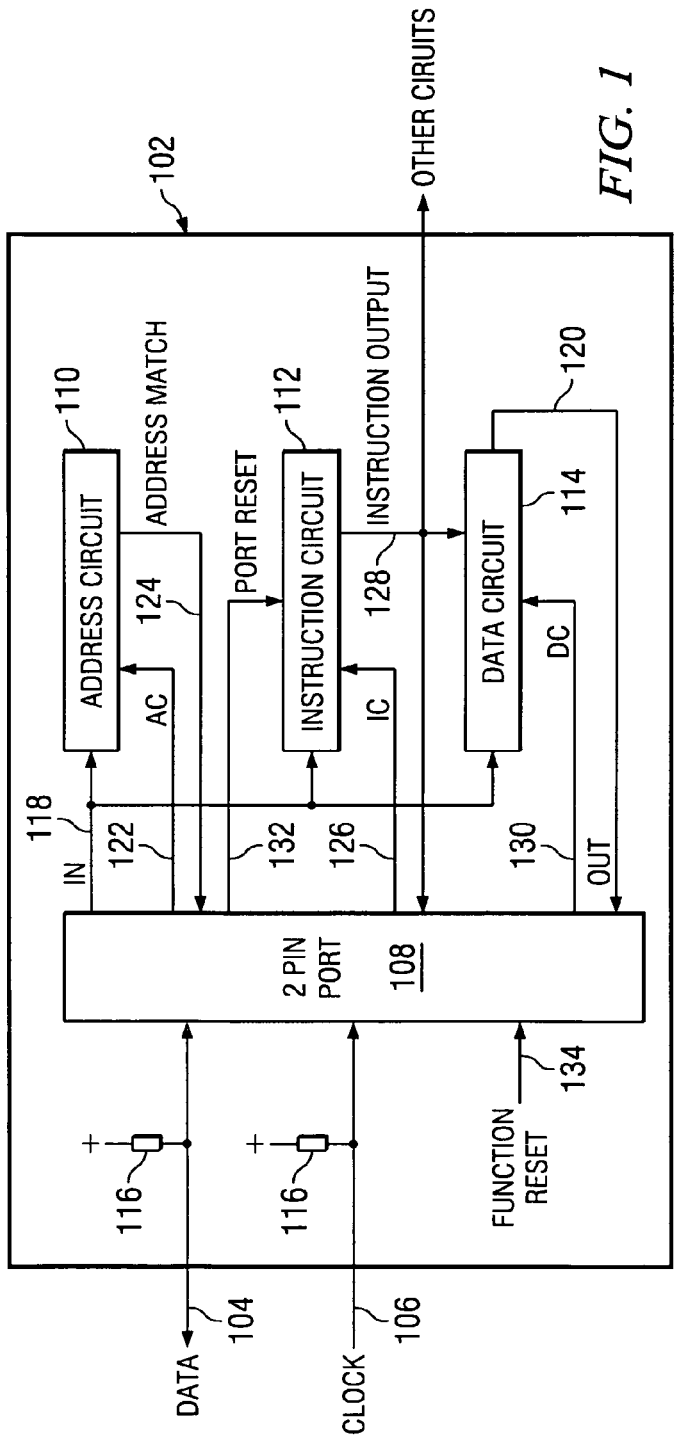
FIG. 1 illustrates the two pin bus interface circuit.

FIG. 1 illustrates the 2 pin bus, interface circuit 102. As seen the 2 pin interface circuit includes an external data lead 104 and clock signal lead 106, both of which are coupled to a 2 pin port 108 within the interface circuit architecture. The data and clock signals include pull up elements 116 to maintain a logic high on the signals whenever they are not externally driven.

The 2 pin port is further coupled to an address circuit 110, instruction circuit 112, and a data circuit 114. The address circuit is controlled by the 2 pin port to input serial data from the data signal lead, via the 2 pin port's In 118 output lead, in response to address control (AC) output 122 from the 2 pin port. The address circuit outputs an address match signal 124 to the 2 pin port. The address match signal indicates whether the address input to the address circuit matches the address of the 2 pin port. If the address matches, the port is selected for further communication, otherwise the port is not selected for further communication.

The instruction circuit is controlled by the 2 pin port to input serial data from the data signal, via the In 118 output, in response to instruction control (IC) output 126 from the 2 pin port. The instruction circuit outputs instruction output 128 to the 2 pin port, the data circuits, and optionally to other circuits external of the 2 pin bus architecture. The instruction output to the 2 pin port regulates the port's data control (DC) outputs 130 to the data circuits. The instruction output to the data circuits selects one of a plurality of data circuits for access. The instruction circuit receives a port reset signal 132 from the 2 pin port which, if active, initializes the instruction circuit to a desired instruction.

The data circuits are controlled by the 2 pin port to simultaneously input and output data via the data signal in response to data control (DC) output 130 from the 2 pin port. The input data to the data circuits comes from the In output 118 of the 2 pin port and the output data from the data circuits is input to the Out 120 input of the 2 pin port. The 2 pin port is optionally coupled to a function reset signal 134 within the IC or core such that it may be reset whenever the IC or core functional circuits are reset, say at power up of the IC or core. When the 2 pin port is reset by the function reset, the instruction circuit is also reset via the port reset signal 132.

Figure 2:
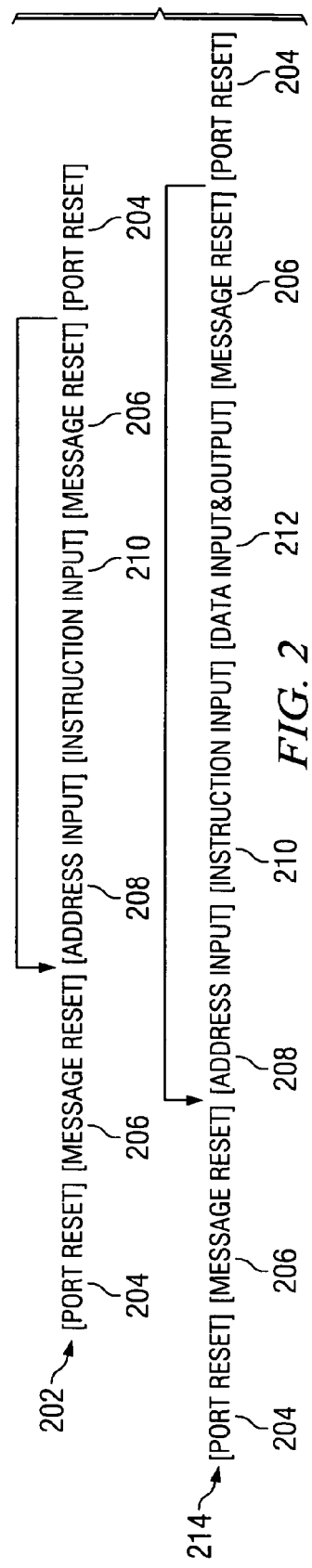
FIG. 2 illustrates two communication messaging operations of the two pin port.

FIG. 2 illustrates two communication messaging operations of the 2 pin port. The top message operation 202 shows the 2 pin port exiting the port reset state 204, entering the message reset state 204, performing an address input 208 to address the port, performing an instruction input 210 to instruct the port, then returning to the message reset state 206. From the message reset state 206 the address and instruction message input can be repeated as indicated by the loop back line, or the 2 pin port can re-enter the port reset state 204. The message reset state 206 resets the 2 pin port but does not reset the instruction circuit via the port reset signal 132. The port reset state 204 resets the 2 pin port and also resets the instruction circuit via the port reset signal 132. Message operation 202 is used to address a port and input an instruction to the addressed port.

The bottom message operation 214 shows the 2 pin port exiting the port reset state 204, entering the message reset state 206, performing an address input 208 to address the port, performing an instruction input 210 to instruct the port, performing a data input and output 212 to write and read data from a data circuit coupled to the port, then returning to the message reset state 206. From the message reset state 206 the address input, instruction input, and data input/output message can be repeated as indicated by the loop back line, or the 2 pin port can re-enter the port reset state 204. Message operation 214 is used to address a port, input an instruction to the addressed port, and communicate data bi-directionally to a data circuit coupled to the port.

Figure 3:
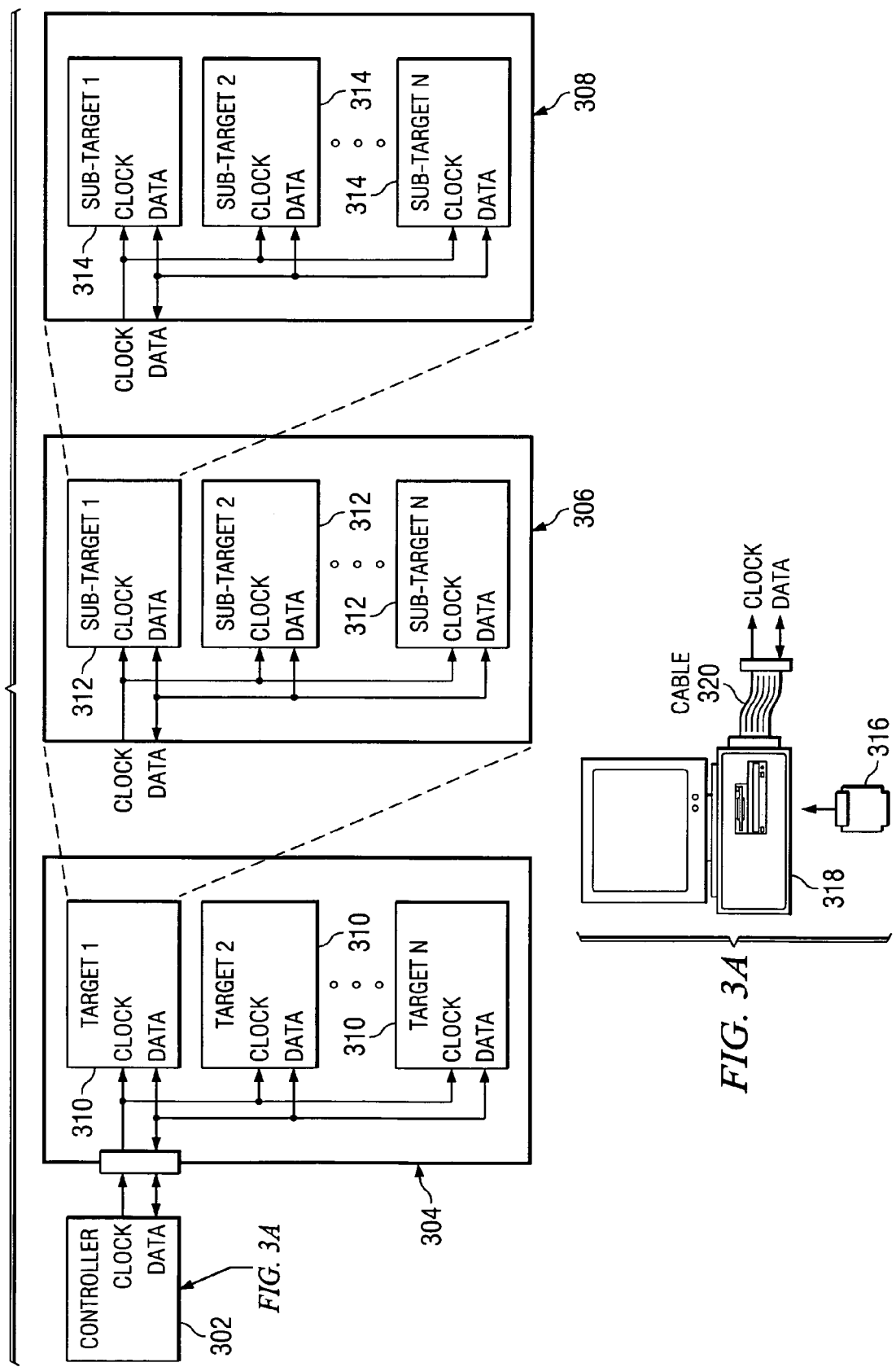
FIG. 3 illustrates two pin bus targets interfaced to a two pin bus controller.

FIG. 3 illustrates 2 pin bus targets interfaced to a 2 pin bus controller 302. The targets may be ICs (or die) 310 on a board or other substrate 304, cores 312 embedded within ICs 306, or cores 314 embedded within cores 312. Each target has a unique address to provide it to be individually selected by the controller 302 for serial message communication independent of the target's physical or hierarchical location in the system (board/IC/core) in which it resides. By transmitting the target address, the controller 302 can input an instruction as shown in message operation 202, or can input an instruction followed by performing a data I/O operation as shown in message operation 214. In addition to having a unique address, each target port contains a global address that provides the controller to address all the targets simultaneously so that all the targets may be loaded with an instruction. The global address and instruction input uses message operation 214.

FIG. 3A is provided to indicate that the controller 302 may be realized by using an interface card 316 in a personal computer 318 to control the clock and data signal communication to the 2 pin bus targets 310-314 via a cable connection 320.

Figure 4:
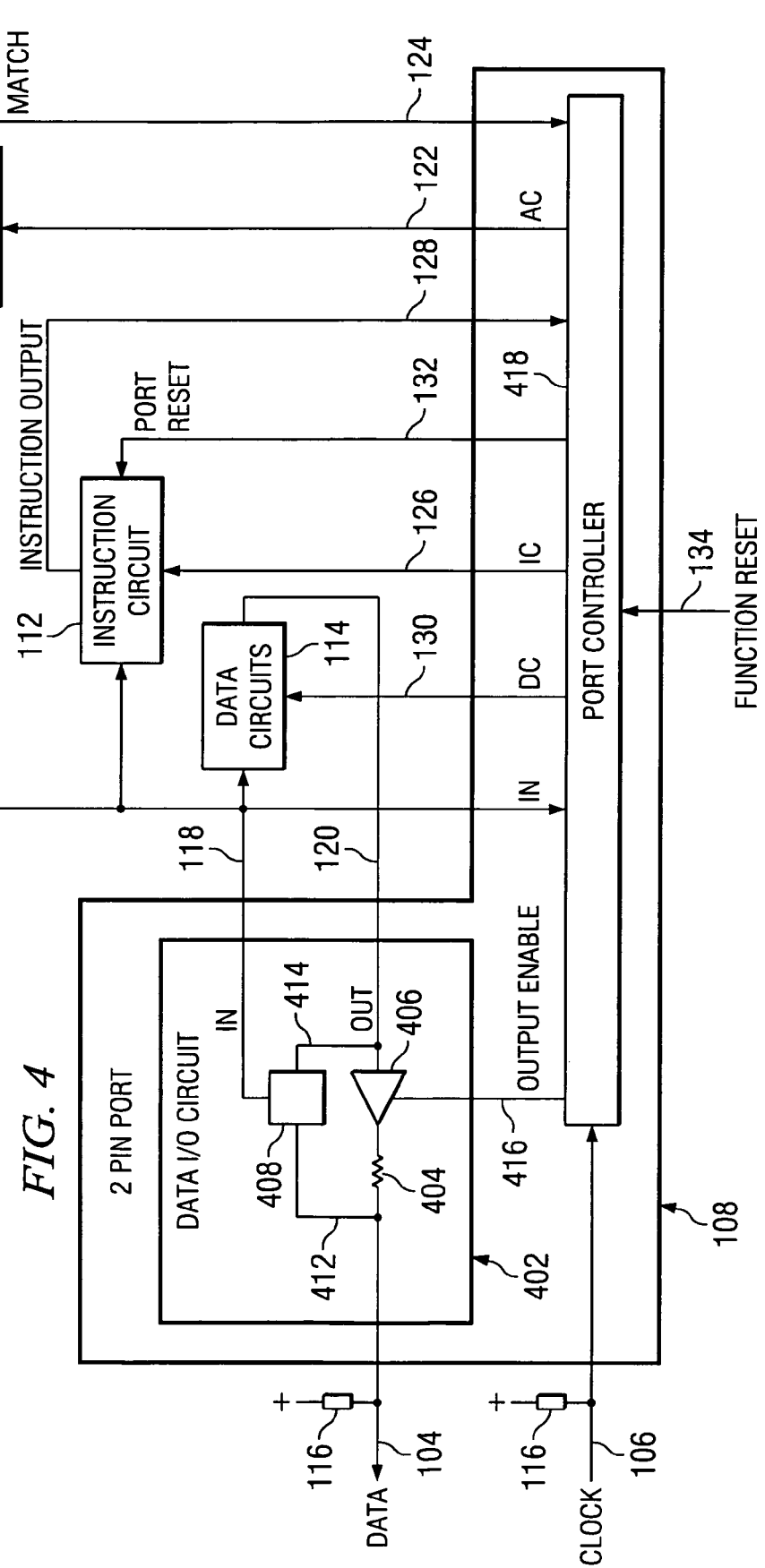
FIG. 4 illustrates the two pin port of FIG. 1 in more detail.

FIG. 4 illustrates the 2 pin port 108 of FIG. 1 in more detail. The 2 pin port includes a data I/O circuit 402 and a port controller circuit 418. The data I/O circuit 402 includes an output buffer 406, a resistor 404, and a data input circuit 408. The output buffer 406 has an input coupled to the Out signal 120 from data circuits 114, an output coupled to one lead of resistor 404, and a 3-state control input coupled to an output enable signal 416 from port controller 418. The other lead of resistor 404 is coupled to data signal lead 104.

The data input circuit 408 has a first input coupled to the data signal lead 104 on lead 412, a second input coupled to the Out signal 120 on lead 414, and an output coupled to In signal 118 to the address, instruction, and data circuits 110-114. If the output enable signal 416 is inactive low, the output buffer 406 is disabled and the data input circuit 408 operates as a conventional 2-state input buffer. That is to say, when the output enable is low, the data input circuit inputs 2-state data from data signal 104 and outputs corresponding 2-state data to In signal 118. If the output enable signal 416 is active high, the output buffer 406 is enabled and the data input circuit 408 operates to evaluate the voltages present at its inputs 412 and 414 and to output an appropriate 2-state signal, based on the evaluation, to In signal 118.

Figure 5:
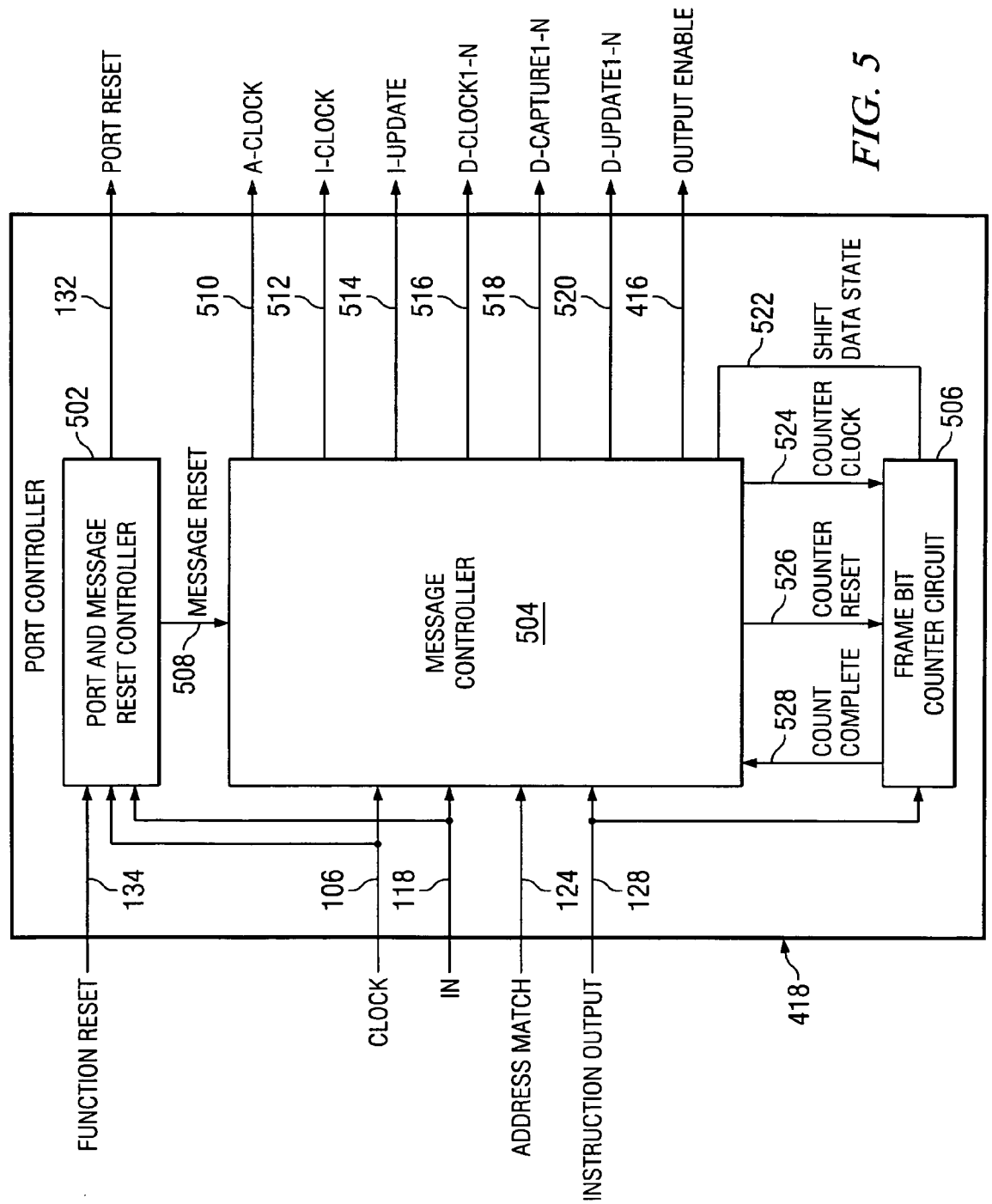
FIG. 5 illustrates the port controller of FIG. 4 in more detail.

FIG. 5 illustrates the port controller 418 of FIG. 4 in more detail. The port controller consists of a port and message reset controller 502, a message controller 504, and a frame bit counter circuit 506. The port & reset controller contains two controllers, a port reset controller and a message reset controller. The port reset controller outputs a message reset signal 508 to reset the message controller 504 and instruction circuit 112 when a port reset sequence is applied on the clock 106 and data 104 (via In signal 118) signals, or in response to a functional reset signal 134. The message reset controller outputs a port reset signal 132 to reset the message controller 504 at the end of each message transaction to provide the message controller to be setup for subsequent message transactions.

The message controller 504 outputs an address clock (A-Clock) signal 510 to shift an address into the address circuit from the In 118. The message controller outputs an instruction clock (I-Clock) signal 512 to shift an instruction into the instruction circuit from the In signal 118 and an instruction update (I-Update) signal 514 to update the instruction shifted into the instruction circuit to the instruction output bus 128. The message controller outputs a number of data clocks (D-Clock1-N) signals 516, a number of data capture (D-Capture) signals 518, and a number of data update (D-Update) signals 520. The D-Clock1-N, D-Capture1-N, and D-Update1-N signals are each associated with a data circuit 1-N, such that a data circuit 1 inputs D-Clock1, D-Capture1, D-Update1, a data circuit 2 inputs D-Clock2, D-Capture2, D-Update2, and so on. The D-Clock signal clocks the data circuit during serial shift and parallel capture operations. The D-Capture signal regulates the shift and capture operations of the data circuit. The D-Update signal cause data shifted into the data circuit to be updated (i.e. output) to the parallel outputs of the data circuit. The message controller outputs an output enable signal 416 to the data I/O circuit 402, a shift data state indication signal 522, a counter clock signal 524, and a counter reset signal 526 to the frame bit counter circuit 506.

The message controller inputs the message reset signal 508 from controller 502, the external clock signal 106, the In signal 118 from data I/O circuit 402, the address match signal 124 from address circuit 110, instruction output signals 128 from instruction circuit 112, and a count complete signal 528 from the counter 506.

Figure 6:
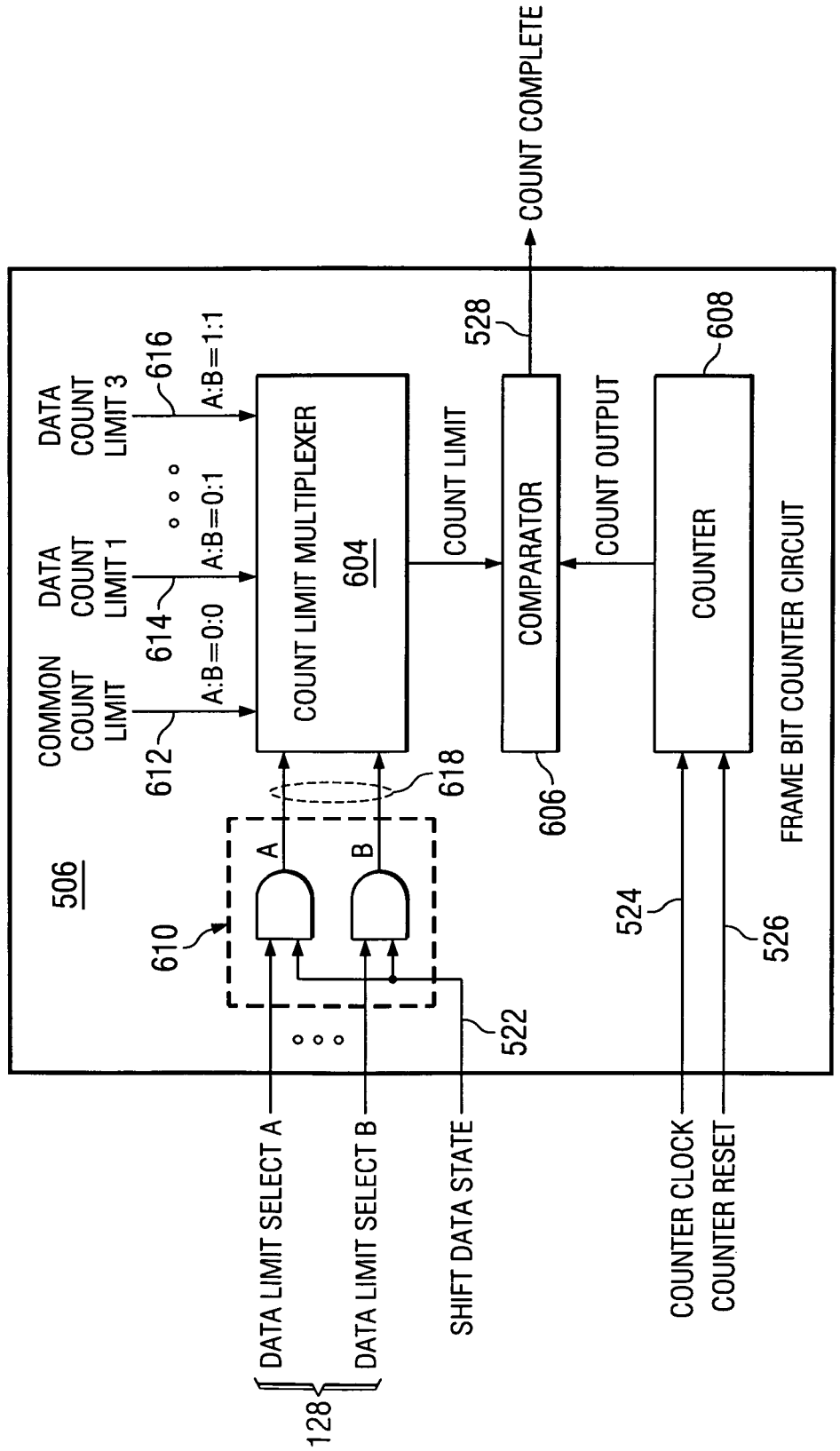
FIG. 6 illustrates the frame bit counter circuit in more detail.

FIG. 6 illustrates the frame bit counter circuit 506 in more detail. Counter circuit 506 includes a counter 608, a comparator 606, a count limit multiplexer 604, and count limit select circuit 610. The counter circuit outputs a count complete signal 528 to the message controller. The counter circuit inputs data limit select A and B signals from instruction output bus 128 and shift data state indication signal 522, counter clock signal 524, and counter reset signal 526 from the message controller 504. The select A and B inputs provide for selecting different length shift operations to data circuits 114 by selecting a count limit 614-616 which differs from the common count limit 612 used by the address and instruction circuits. If the select A and B signals 128 are low or if the shift data state indication signal 522 is low, the count limit select circuit 610 will select the common count limit 612 to be input to the comparator. If the shift data state indication signal 522 is high, the values input on the select A and B inputs will determine the count limit 612-616 to be input to the comparator.

For example, if A:B=0:0 the common count limit 612 is input, if A:B=0:1 a data count limit 1 614 is input, if A:B=10 a data count limit 2, while not shown, is input, and if A:B=1:1 a data count limit 3 616 is input. While two select signals (A and B) are shown to select one of four count limits, any number may be used to select any number of count limits to the comparator 606. The count limit select circuit 610 may be modified as required for more or less count limit select inputs 128 from the instruction register and to correspondingly output more or less select control inputs 618 to the count limit multiplexer 604.

Prior to performing a shift operation to the address, instruction, or data circuits the counter 608 will be reset to a count of zero. Each time a data bit is shifted into the one of the address, instruction, or data circuits the counter increments. The count output from the counter is input to the comparator along with the count limit from the count limit multiplexer 604. When the count output matches the count limit the comparator outputs a count complete signal 528 to the message controller 504. In response to the count complete signal being set, the message controller will cease the shift operation and perform a next operation.

The shift path lengths of the address circuit 110 and instruction circuit 112 are the same. For example they may both be 16 bits long. During address and instruction shift operations the A and B inputs to the count limit multiplexer 604 will be set to select the common count limit 612 to be input to the comparator. The common count limit 612 for the example 16 bit shift will be a count of 16. If a data circuit shift path length is also 16 bits, the common count limit of 16 can be used for shifting the data circuit as well. However, if a data circuit has a shorter or longer shift path length than 16, the select A and B inputs enable a different count limit to be used for the data circuit.

For example, if a data circuit has a shift path of 512 bits, a data count limit of 512 will provided and selected by the count limit multiplexer to be input to the comparator. If the shift path length of another data circuit is 256 bits long, a data count limit of 256 will be provided and selected by the count limit multiplexer for input to the comparator. The ability to use the select A and B inputs to select different count limits 612-616 is only available during times when the message controller 504 is shifting data through a data circuit, i.e. when the shift data state indicator signal 522 is high. During the address and instruction shift operations, the shift data state indicator 522 will be low which forces the common count limit 612 to be used, independent of the select A and B inputs.

Figure 7:
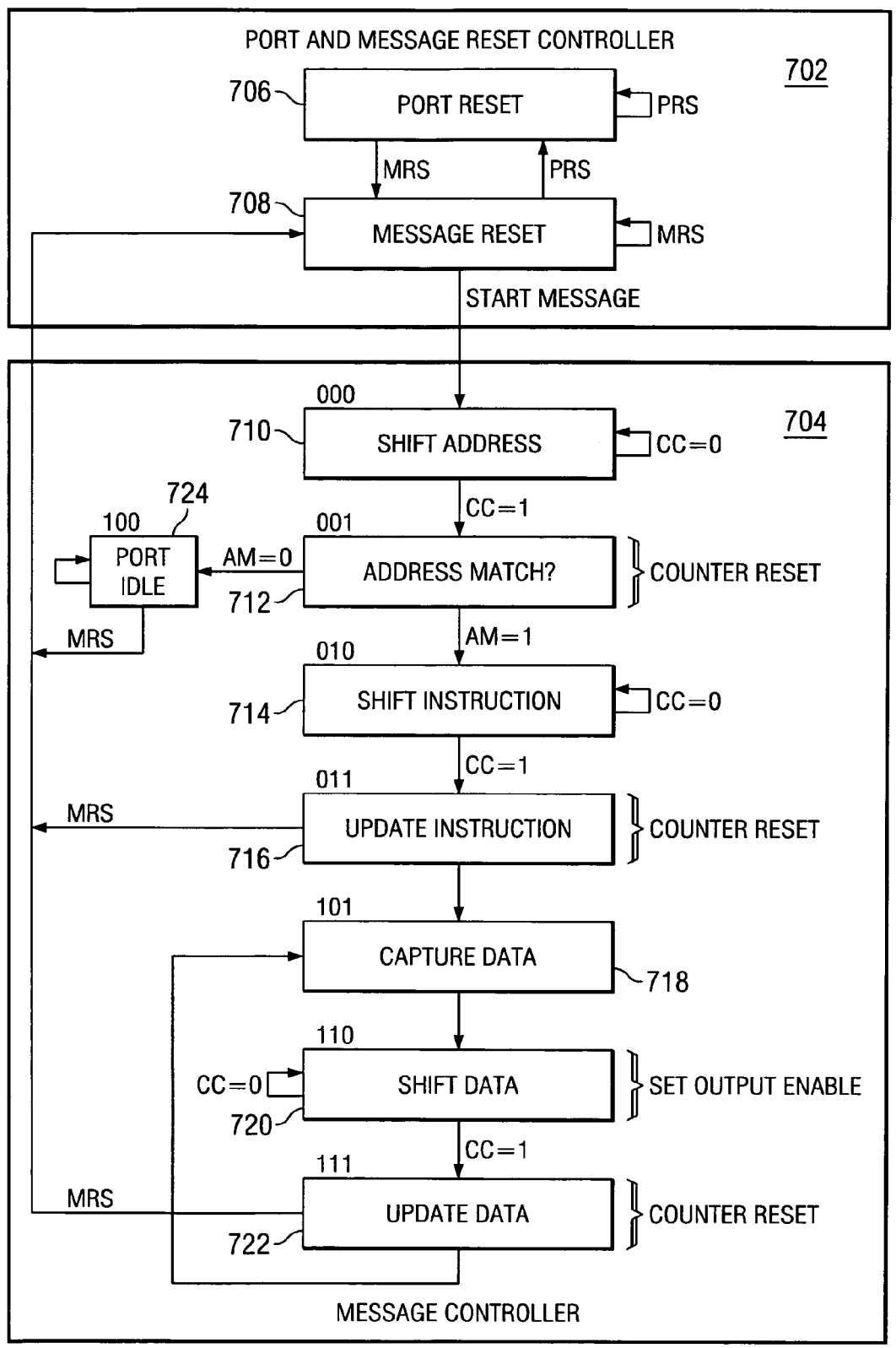
FIG. 7 illustrates the state diagrams of the port and message reset controller and the message controller.

FIG. 7 illustrates the state diagrams of the port and message reset controller 502 and the message controller 504. Following a functional reset or in response to a port reset sequence (PRS), the port & message reset controller will be in the port reset state 706. The port reset signal 132 and message reset signals 508 are active low while the port & message reset controller 502 is in the port reset state. In response to a message reset sequence (MRS) the port & message reset controller will be in the message reset state 708. The message reset signal 508 is active low while the port & message reset controller 502 is in the message reset state 708.

A message may be initiated by transitioning from the message reset state 708 of the port & message reset controller to the shift address state 710 of the message controller. The message controller remains in the address shift state 710 shifting address bits into the address circuit until the count complete (CC) signal from counter circuit 506 goes high. From the address shift state 710 the message controller transitions to the address match state 712 to test for a match between the address shifted in and the 2 pin port's address and to reset the counter 608 via the counter reset signal 526. If the address does not match, the message controller transitions to the port idle state 724 and remains there until a message reset sequence (MRS) occurs.

If the address matches, the message controller transitions to the shift instruction state 714 to shift in an instruction. When the count complete (CC) signal goes high, the message controller transitions to the update instruction state 716 to update the instruction to the instruction output bus 128 and to reset the counter 608 via the counter reset signal 526. If a message reset sequence (MRS) occurs during the update instruction state 716, the message controller transitions from the update instruction state 716 to the message reset state 708 of the port & message reset controller 502 to terminate the message.

If the message terminates from the update instruction state 716, the message is an address and instruction message as illustrated in messaging operation 202 of FIG. 2. If a message reset sequence (MRS) does not occur during the update instruction state 716, the message controller transitions to the capture data state 718. In the capture data state 718 the parallel inputs of the data circuit 114 selected by the loaded instruction are captured in the data circuit. From the capture data state 718 the message controller transitions to the shift data state 720. During the shift data state, the output enable signal 416 to the data I/O circuit 402 is set high, which enables the data I/O circuit 402 to simultaneously input and output data on data signal 104, as mentioned in regard to FIG. 4. Also during the shift data state, the selected data circuit 114 shifts data in from the In signal 118 output of data I/O circuit 402 and shifts data out to the Out signal 120 input of data I/O circuit 402.

When the count complete (CC) signal goes high, the message controller transition from the shift data state 720 to the update data state 722. During the update data state, the selected data circuit outputs the data shifted in, resets the counter 608 via counter reset signal 526, and sets the output enable signal 416 back low. If a message reset sequence (MRS) occurs during the update data state 722, the message controller transitions from the update data state 722 to the message reset state 708 of the port & message reset controller 502 to terminate the message. If the message terminates from the data update state 722, the message is an address, instruction, and data message as illustrated in messaging operation 214 of FIG. 2. If a message reset sequence (MRS) does not occur during the update data state 722, the message controller transitions to the capture data state 718 to repeat the above mentioned data capture, shift, and update operation steps. The data capture, shift, and update operation steps can be repeated as necessary to achieve a desired number of data input and output operations associated with a test, debug, trace, emulation, or other support or functional input/output operation required in the IC or core in which the 2 pin bus is implemented.

From the above description, it is clear that address circuit and instruction circuit input operations occur while the output enable signal 416 is low, which makes the data I/O circuit 402 operate as a 2 state input buffer whereby data may be transferred uni-directionally from a 2 pin bus controller 302 to the a 2 pin bus target as shown in FIG. 3A via the data signal 104. It is also clear that data circuit input/output operations occur while the output enable signal 416 is high, making the data I/O circuit 402 operate in its input and output mode whereby the data is simultaneously transferred bi-directionally between the 2 pin bus controller 302 and a 2 pin bus target of FIG. 3A via the data signal 104. These two modes of the data I/O circuit 402 were described previously in regard to FIG. 4.

Figure 8A:
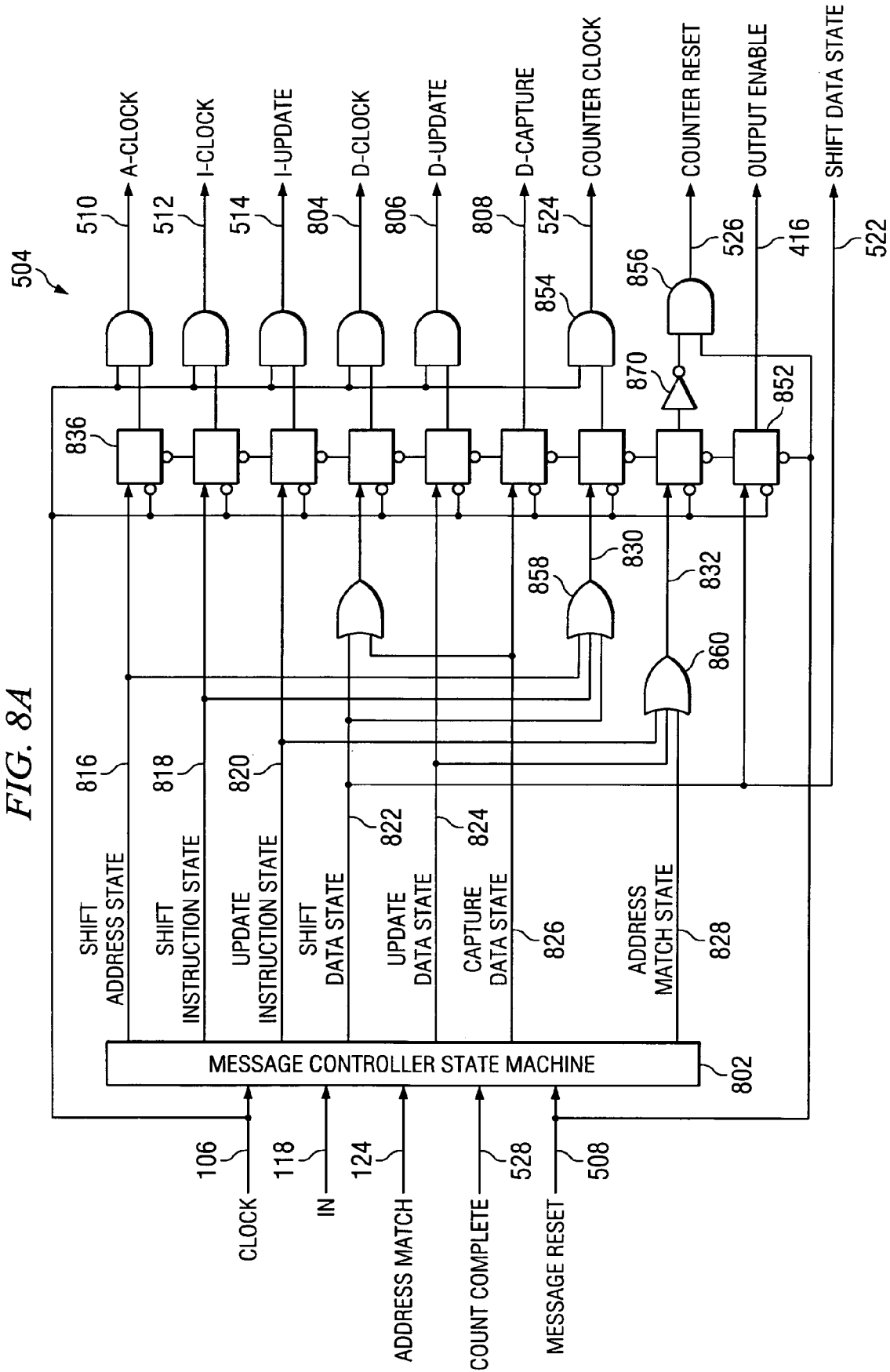
FIGS. 8A and 8B illustrate an example implementation of controller of FIG. 5.
Figure 8B:
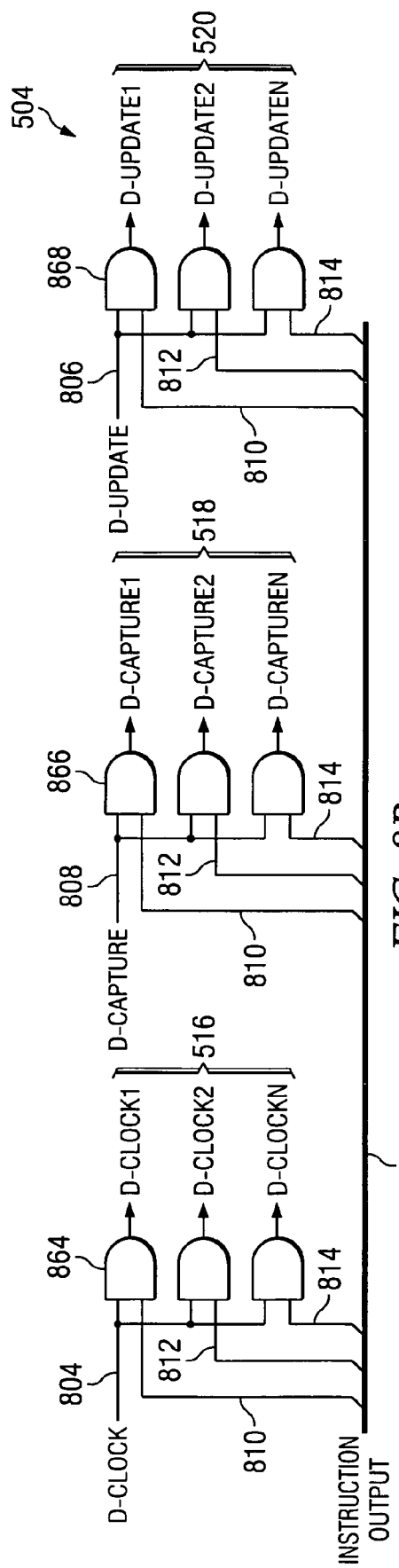

FIGS. 8A and 8B illustrate an example of how the message controller 504 of FIG. 5 may be designed. The message controller consists of a message controller state machine 802 having output leads carrying signals indicating when the state machine is in certain states. These leads are the shift address state lead 816, shift instruction state lead 818, update instruction state lead 820, shift data state lead 822, update data state lead 824, capture data state lead 826, and address match state lead 828. The message controller 504 also includes flip flops 836-852, and various And, Or, an inverter gating circuits. The state machine 802 responds to the rising edge of clock signal 106 and the flip flops 836-852 respond to the falling edge of the clock signal 106. This timing provides for glitch free gating of clock and control output signals from the message controller 504.

While the message reset input 508 is low, the state machine is forced to and remains in the shift address state 710 of the state diagram of FIG. 7, and the flip flops 836-852 are held in reset. When the message reset input 508 goes high, the reset condition on the state machine and flip flops is removed and the state machine operates as described in regard to the state diagram of FIG. 7. While the state machine is in the shift address state, the A-Clock signal 510 will be gated on to output clock signals 106 to the address circuit 110. While the state machine is in the shift instruction state, the I-Clock signal 512 will be gated on to output clock signals 106 to the instruction circuit 112. While the state machine is in the update instruction state, the I-Update signal 514 will be gated on to update the outputs of the instruction circuit While the state machine is in the shift data state, the D-Clock signal 804 will be gated on to output clock signals 106 to the selected data circuit 114. While the state machine is in the update data state, the D-Update signal 806 will be gated on to update the output of the selected data circuit. While the state machine is in the data capture state, the D-Capture signal 808 and D-Clock signal 804 will be gated on to cause the selected data circuit to capture data. The counter clock signal 524 will be gated on whenever the state machine is in, the shift address, shift instruction, or shift data state. The counter reset signal 526 will be gated on whenever the state machine is in the update instruction, update data, or address match state, or when the message reset signal is low. The output enable signal 416 will be gated on whenever the state machine is in the shift data state. The shift data state indication signal 522 will be gated on whenever the state machine is in the shift data state.

In FIG. 8B the D-Clock signal 804 is input to gating circuits 864, the D-Capture signal 808 is input to the gating circuits 866, and the D-Update signal 806 is input to the gating circuits 868. Instruction output bus signals 810, 812, and 814 are input to the gating circuits 864, 866, and 868. If instruction signal 810 is high, the D-Clock signal outputs to the D-Clock1 signal of 516, the D-Capture signal 808 outputs to D-Capture1 signal of 518, and D-Update signal 806 outputs to D-Update1 signal of 520. If instruction signal 812 is high, the D-Clock signal outputs to the D-Clock2 signal of 516, the D-Capture signal 808 outputs to D-Capture2 signal of 518, and D-Update signal 806 outputs to D-Update2 signal of 520. If instruction signal 814 is high, the D-Clock signal outputs to the D-ClockN signal of 516, the D-Capture signal 808 outputs to D-CaptureN signal of 518, and D-Update signal 806 outputs to D-UpdateN signal of 520. Thus instruction output signals 810-814 selectively direct the D-Clock 804, D-Update 806, and D-Capture 808 output signals to the selected data circuits 114 1-N, respectively.

Figure 9:
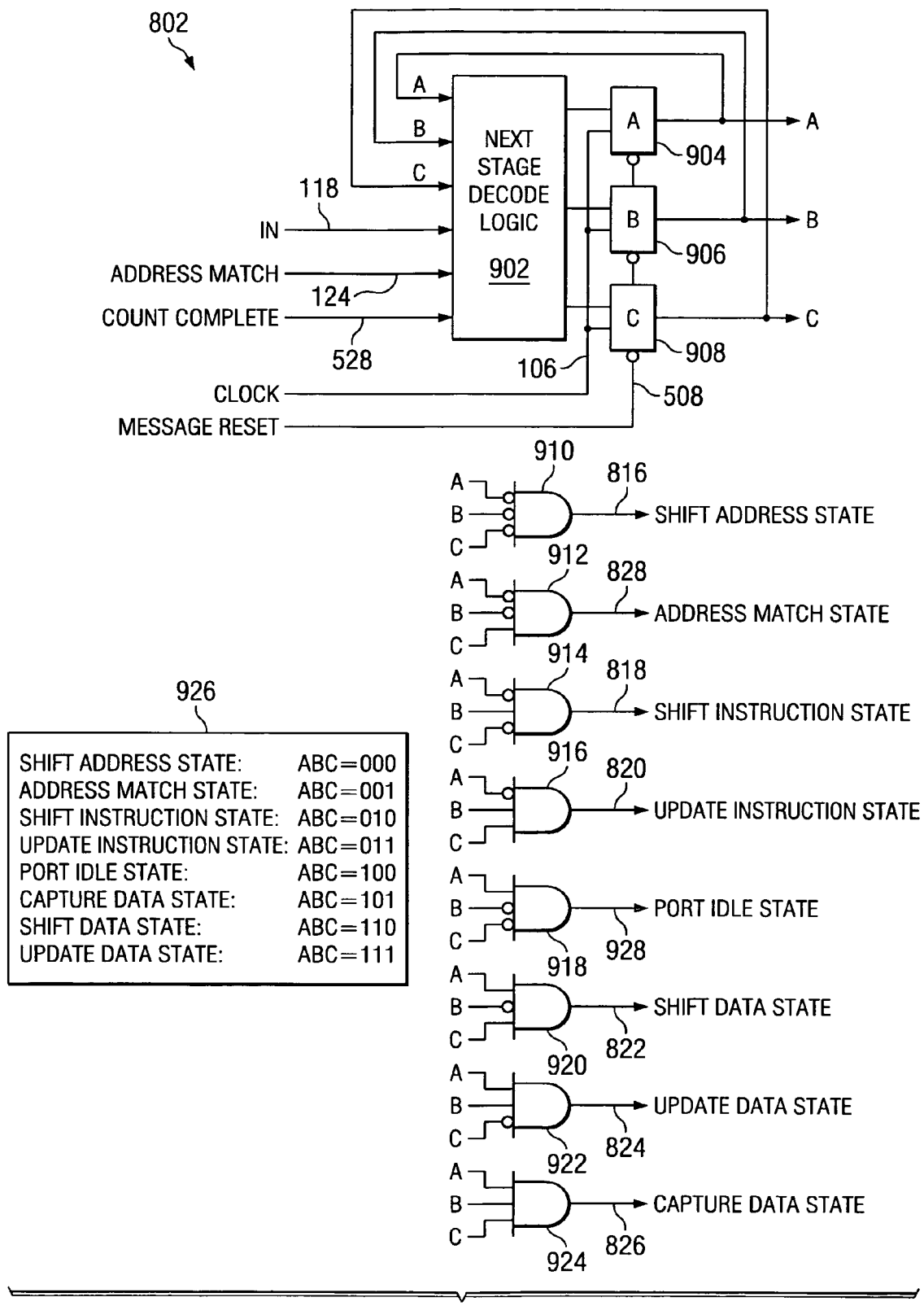
FIG. 9 illustrates an example implementation of the message controller state machine of FIG. 8.

FIG. 9 illustrates an example of how the message controller state machine 802 of FIG. 8 may be designed. The state machine consists of next state decode logic 902, state flip flops A, B, C 904-908, and output state decode logic 910-924. If the message reset input 508 is low, the state machine is reset to the shift address state 816, (ABC=000). If the message reset input is high, the state machine responds to the rising edge of the clock input 106 to transition through its states according to the In 118, address match 124, and count complete 528 inputs shown in state diagram 704 of FIG. 7. The A, B, C state assignments are shown in box 926. The output state decode logic 910-924 provides the signals shown in FIG. 8 on the shift address state lead 816, address match state lead 828, shift instruction state lead 818, update instruction state lead 820, shift data state lead 822, update data state lead 824, and capture data state lead 826. The port idle state signal on lead 928 is also shown being decoded in the event it is needed for indicating when the port is in the idle state.

Figure 10:
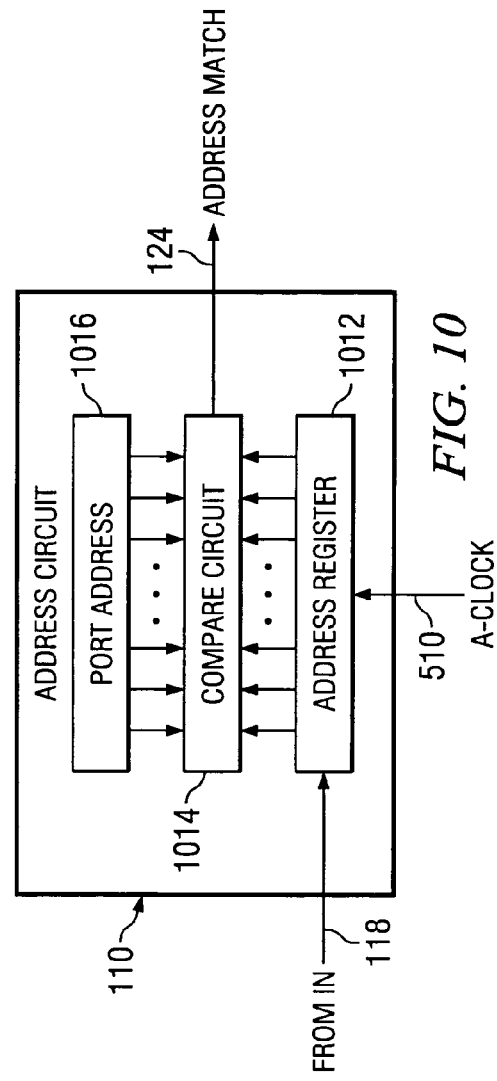
FIG. 10 illustrates an example implementation of the address circuit of FIG. 1.

FIG. 10 illustrates an example of how the address circuit 110 of FIG. 1 may be designed. The address circuit consists of an address shift register 1012, an address compare circuit 1014, and a port address circuit 1016. The shift register 1012 responds to A-Clock 510 inputs to shift in an address from the In 118 input. The compare circuit 1014 operates to compare the address shifted into the shift register 1012 to the address in the port address circuit 1016. The compare circuit outputs the result of the compare on the address match signal 124. The port address in circuit 1016 may be a hardwired address, an address provided by the blowing of electronic fuses, an address programmed into a programmable memory, an address functionally written into a memory, an address shifted into a shift register, or by any other suitable address supplying means.

In addition to the port's individual address, the port address circuit 1016 also contains the global address mentioned in regard to FIG. 3. The global address is the same for all 2 pin ports, which enables all ports to addressed at the same time for inputting an instruction to all the ports using message 202 of FIG. 2. The global address must not be used by any port as an individual port address. The compare circuit is capable of comparing the data shifted into the address register 1012 against both the individual port address and the global port address output from port address circuit 1016. If a match occurs between the data in the address register 1012 and the individual or global port address, the address match signal 124 will be set high.

FIG. 11 illustrates an example of how the instruction circuit 112 of FIG. 1 may be designed. The instruction circuit consists of an instruction shift register 1112, instruction decode logic 1114, and an instruction update register 1116. The shift register 1112 responds to I-Clock 512 inputs to shift in an instruction from the In 118 input. The decode logic 1114 operates to decode the instruction shifted into the shift register 1112 and to output the decode to the update register 1116. The update register 1116 stores the instruction decode in response to the I-Update signal 514. The stored instruction decode is output from the update register to the instruction output bus 128. The port reset signal 132 is input to both the shift register 1112 and update register 1116 to reset the registers to known states when the port reset signal is active low.

FIG. 12 illustrates in general an example of how data circuits 1112 within data circuit block 114 of FIG. 1 may be designed. Each data circuit will consist of a data register 1214 having a serial input coupled to the In 118 signal, a serial data output coupled to the Out 120 signal, and parallel inputs and parallel outputs coupled to a source and/or destination circuit 1216. A data register 1214 may have only parallel inputs from a source circuit, only parallel outputs to a destination circuit, or both parallel inputs from a source circuit and parallel outputs to a destination circuit. The source and destination circuits may be part of the data circuit 1112 or they may be separate circuits coupled to the data circuit 1112. In data register circuit 1222, it is seen that a data register 1214 may include only a shift register 1218 that is coupled serially to the In and Out signals and in parallel to the source and/or destination circuits. In data register circuit 1224, it is seen that a data register 1214 may additionally include an update register 1220 between the parallel outputs of the shift register 1218 and the parallel inputs of the destination circuit.

If the D-Capture signal 518 is high, the shift register 1218 captures parallel data from a connected source in response to the D-Clock signal 516. If the D-Capture signal 518 is low, the shift register 1218 shifts data from the In 118 signal to the Out 120 signal in response to the D-Clock signal 516. At the end of the shift operation, the update register 1220, if implemented as shown in 1224, stores the parallel outputs from the shift register 1218 in response to the D-Update signal 520 and outputs the stored parallel outputs to a destination circuit. If an update register 1220 is not implemented, as shown in 1222, the parallel outputs from the shift register 1218 are input directly to the destination circuit. As seen in the data circuit 1112 of FIG. 12, the D-Update signal 520, D-Capture signal 518, and D-Clock signal 516 may be input to the source and/or destination circuits. The D-Update signal can be used to directly control or indicate when the destination circuit should input parallel data from the data register 1214. The D-Capture signal can be used to directly control or indicate when the source circuit should output parallel data to the data register 1214. The D-Clock signal can be used as a clock input to the source and/or destination circuits to provide the timing for data input and/or output operations.

Figure 13:
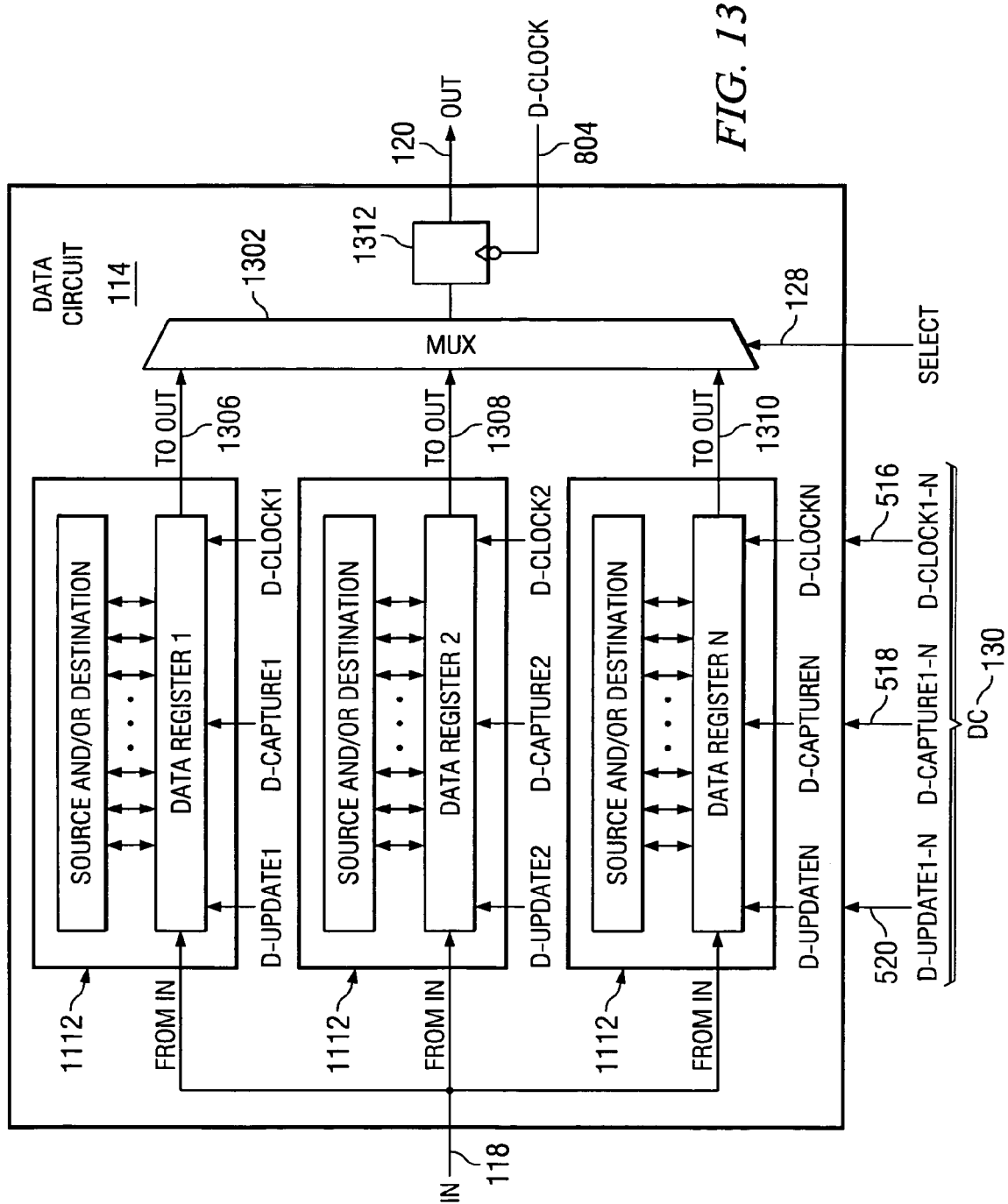
FIG. 13 illustrates the data circuits block of FIG. 1.

FIG. 13 illustrates the data circuits block 114 of FIG. 1. The data circuits block consists of 1-N data circuits 1112 a multiplexer 1302, and falling edge triggered flip flop 1312. Data circuit 1 receives D-Update1, D-Capture1, and D-Clock1 signals from control buses 516-520 of DC bus 130. Data circuit 2 receives D-Update2, D-Capture2, and D-Clock2 signals from control buses 516-520 of DC bus 130. Data circuit N receives D-UpdateN, D-CaptureN, and D-ClockN signals from control buses 516-520 of DC bus 130. Each data circuit 1-N receives serial input from In signal 118, and each output separate serial outputs 1306-1310 to multiplexer 1302. Multiplexer 1302 outputs to the Out signal 120, via flip flop 1312, and receives select input signals from instruction output bus 128 to select which data circuit 1112 serial output 1306-1310 is coupled to the Out signal 120. Flip flop 1312 is clocked by the D-Clock signal 804.

When an instruction is loaded into the instruction circuit 112 to select one of the data circuits 112 in data circuits block 114 for a data I/O operation, the selected data circuit's serial output will be coupled to the Out signal 120 via multiplexer 1302 and flip flop 1312 and the appropriate D-Update, D-Capture, and D-Clock signal inputs to the data circuit from the message controller 504 will be enabled. Once selected the data register will capture parallel data input from a source, shift data from In signal 118 to Out signal 120, and update parallel data output to a destination. During the capture and shift operations of any selected data circuit 1112, flip flop 1312 will be clocked by the falling edge of D-Clock 508 to pass data from multiplexer 1302 to the data I/O circuit 402 via Out signal 120. While the selected data circuit 112 is performing a data I/O operation, the other non-selected data circuits 1112 of data circuits block 114 will remain inactive. The following FIGS. 14-16 illustrate three examples of different data circuit 1112 types.

Figure 14:
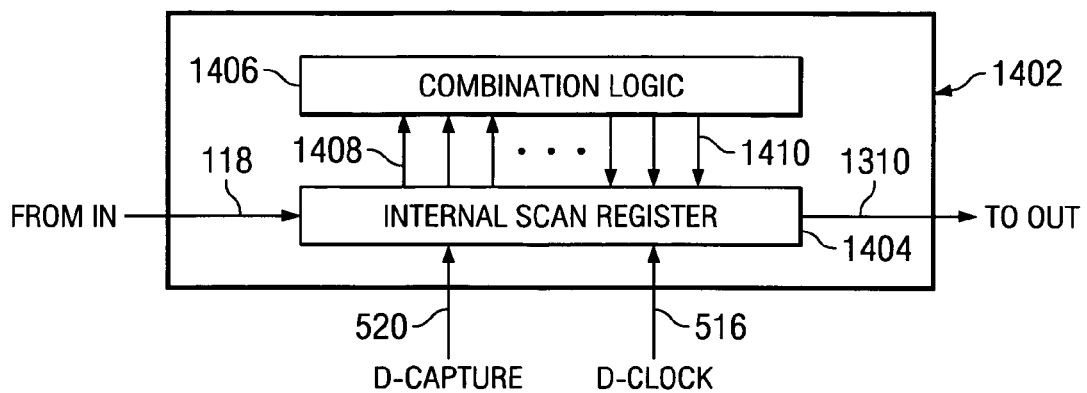
FIG. 14 illustrates a data circuit as an internal scan register coupled to combination logic.

The data circuit 1402 of FIG. 14 illustrates that a data circuit may be an internal scan register 1404 coupled to combination logic 1406 to provide scan testing of the combinational logic. During scan testing, the D-Capture and D-Clock signals cause the internal scan register to capture test response data from the combination logic and to shift the response data out to Out signal 120 while the next test stimulus data is shifted into the internal scan register from In signal 118 to be output to the combination logic. The D-Update signal is typically not required during internal scan testing operations, so it is not shown connected to the internal scan register 1404. The internal scan register 1404 would typically appear as data register 1222 of FIG. 12. The inputs 1408 to the combination logic 1406 would be the destination outputs of shift register 1218 and the outputs 1410 from the combination logic 1406 would be the source inputs to shift register 1218.

Figure 15:
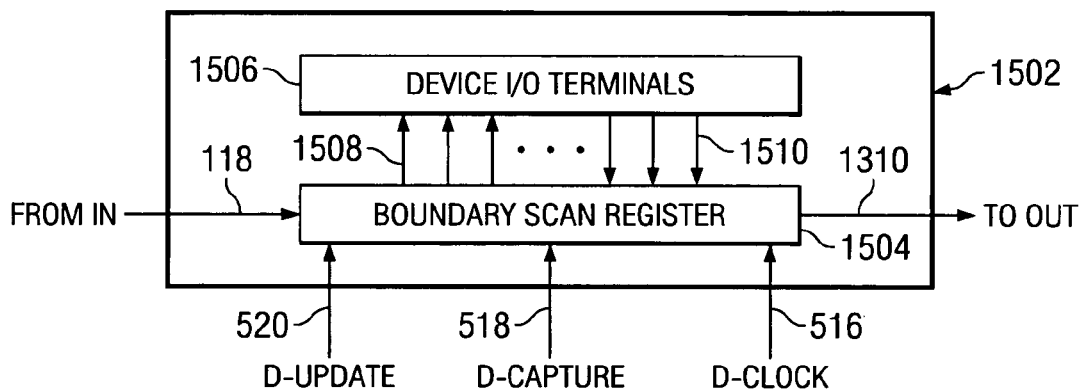
FIG. 15 illustrates a data circuit as a boundary scan register coupled to the device's (IC or core) I/O terminals.

The data circuit 1502 of FIG. 15 illustrates that a data circuit may be a boundary scan register 1504 coupled to the device's (IC or core) I/O terminals 1506 to provide boundary scan testing at the device I/O terminals. During boundary scan testing, the D-Capture and D-Clock signals cause the boundary scan register to capture test response data from the device I/O terminals and to shift the response data out to Out signal 120 while the next test stimulus data is shifted into the boundary scan register from the In signal 118 to be output to the device I/O terminals in response to the D-Update signal. The D-Update signal is typically required during boundary scan testing, so it is shown connected to the boundary scan register 1504. The boundary scan register 1504 would typically appear as data register 1224 of FIG. 12. The inputs 1508 to the device I/O terminals 1506 would be the destination outputs of update register 1220 and the outputs 1510 from the device I/O terminals 1506 would be the source inputs to shift register 1218.

Figure 16:
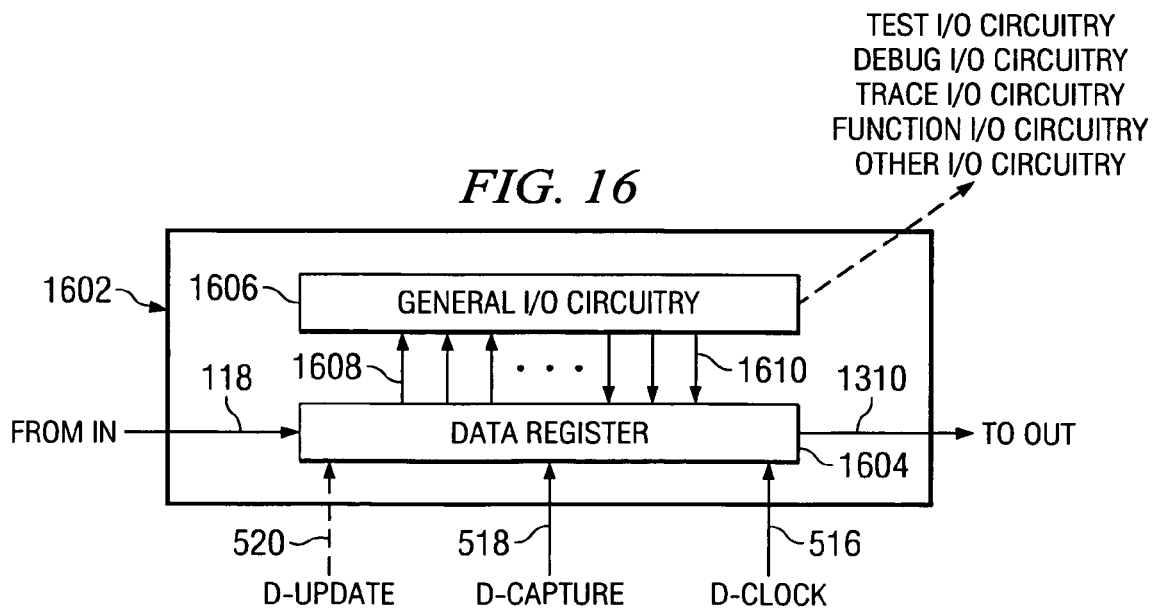
FIG. 16 illustrates a data circuit as a data register.

The data circuit 1602 of FIG. 16 illustrates that a data circuit may be data register 1604 for performing general purpose I/O operations to test, debug, trace, functional, or other I/O circuits 1606. During data I/O operations, the D-Capture and D-Clock signals cause the data register to capture data input from I/O circuitry 1606, to shift the captured data out to Out signal 120, and to shift input data into the data register from the In signal 118 to be output to the I/O circuitry 1606 in response to the D-Update signal.

The D-Update signal to data register 1604 may or may not be needed for data I/O operations, so it is shown in dotted line. If the D-Update signal is not needed, data register 1604 would appear like circuit 1222 of FIG. 12 in that the inputs 1608 to the I/O circuitry 1606 would be the destination outputs of shift register 1218 of circuit 1222 and the outputs from the I/O circuitry 1606 would be the source inputs to shift register 1218 of circuit 1222. If the D-Update signal is needed, data register 104 would appear like circuit 1224 of FIG. 12 in that the inputs 1608 to the I/O circuitry 1606 would be the destination outputs of update register 1220 of circuit 1224 and the outputs from the I/O circuitry 1606 would be the source inputs to shift register 1218 of circuit 1224.

Figure 16A:
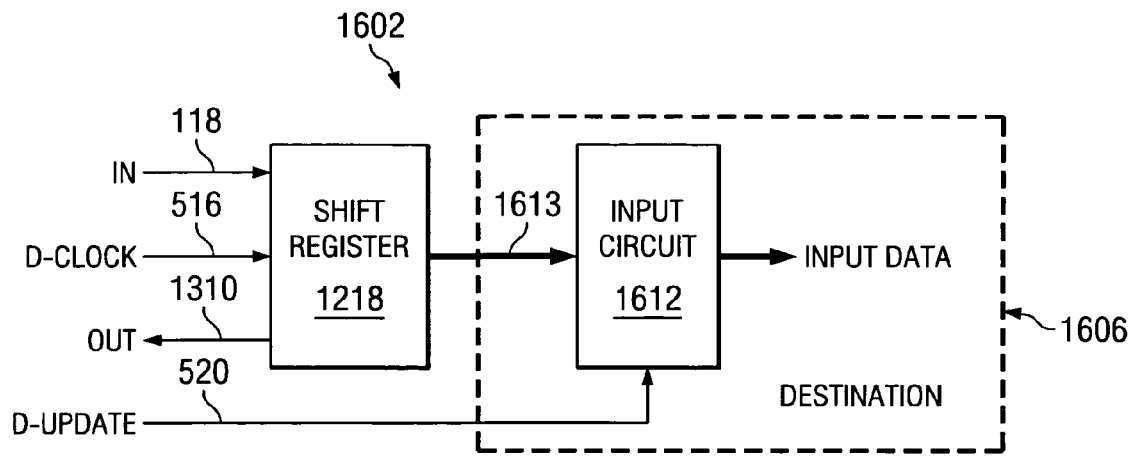
FIG. 16A illustrates the data register realized as the shift register of FIG. 12, and the I/O circuit realized as an destination input circuit.
Figure 16B:
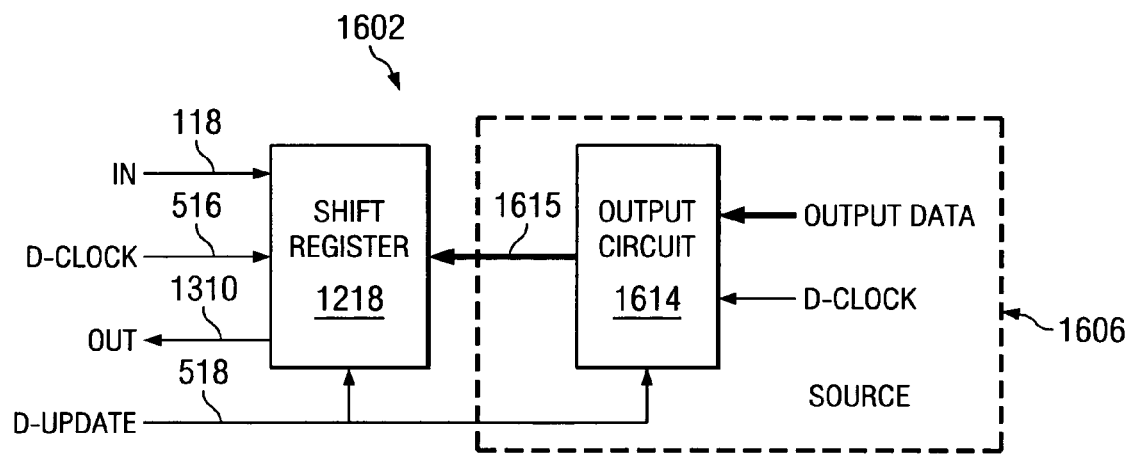
FIG. 16B illustrates the data register realized as the shift register of FIG. 12, and the I/O circuit realized as a source output circuit.
Figure 16C:
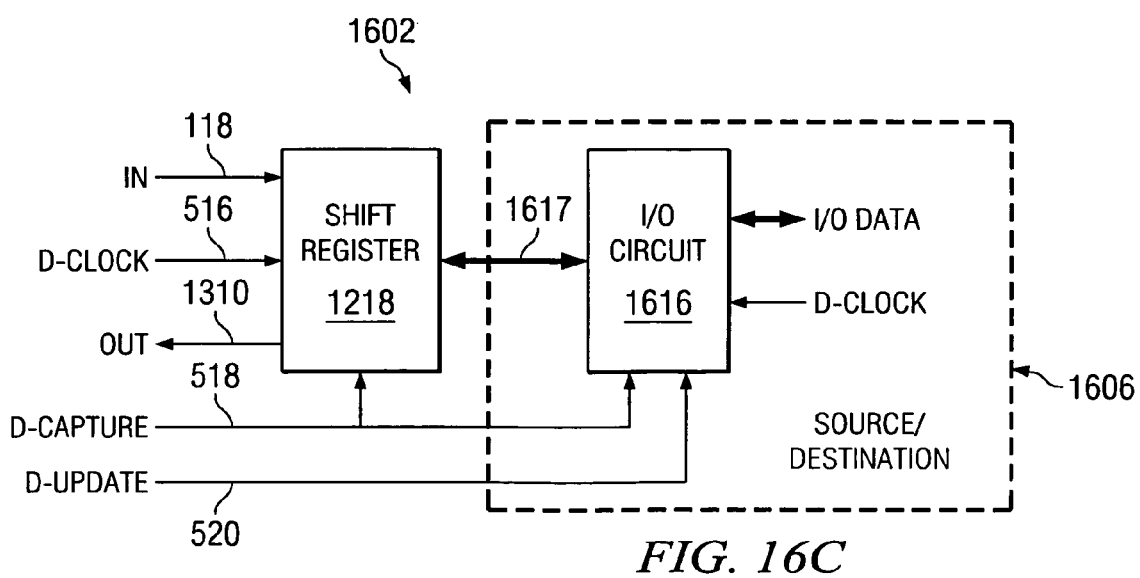
FIG. 16C illustrates the data register realized as the shift register of FIG. 12, and the I/O circuit realized as both a source output circuit and as a destination input circuit.
Figure 16D:
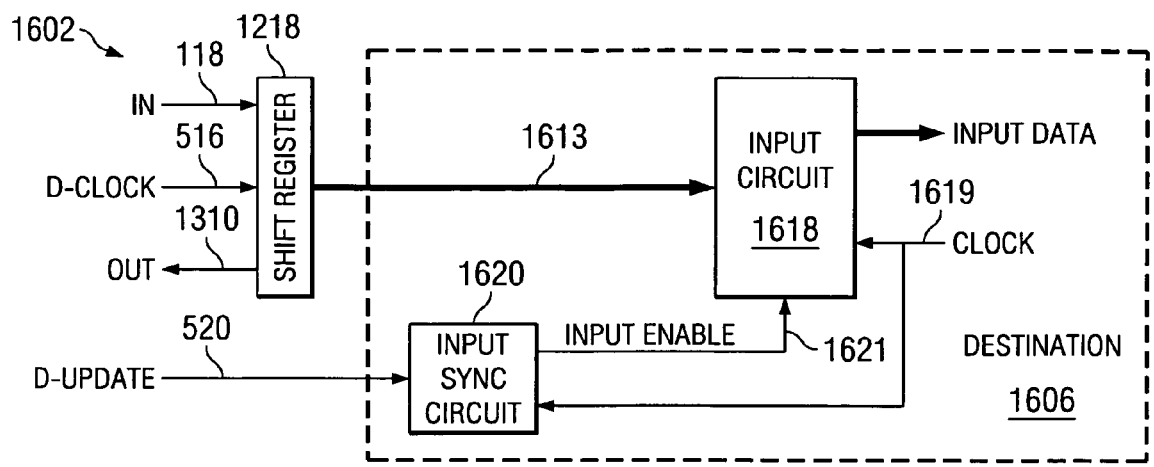
FIG. 16D illustrates the data register realized as the shift register of FIG. 12, and the I/O circuit realized as an destination input circuit.
Figure 16E:
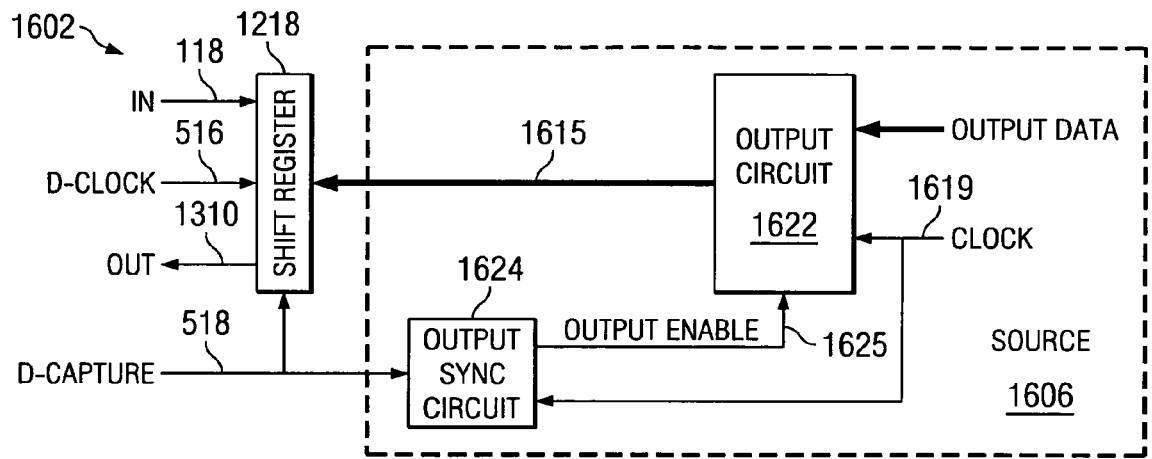
FIG. 16E illustrates the data register realized as the shift register of FIG. 12, and the I/O circuit realized as a source output circuit.
Figure 16F:
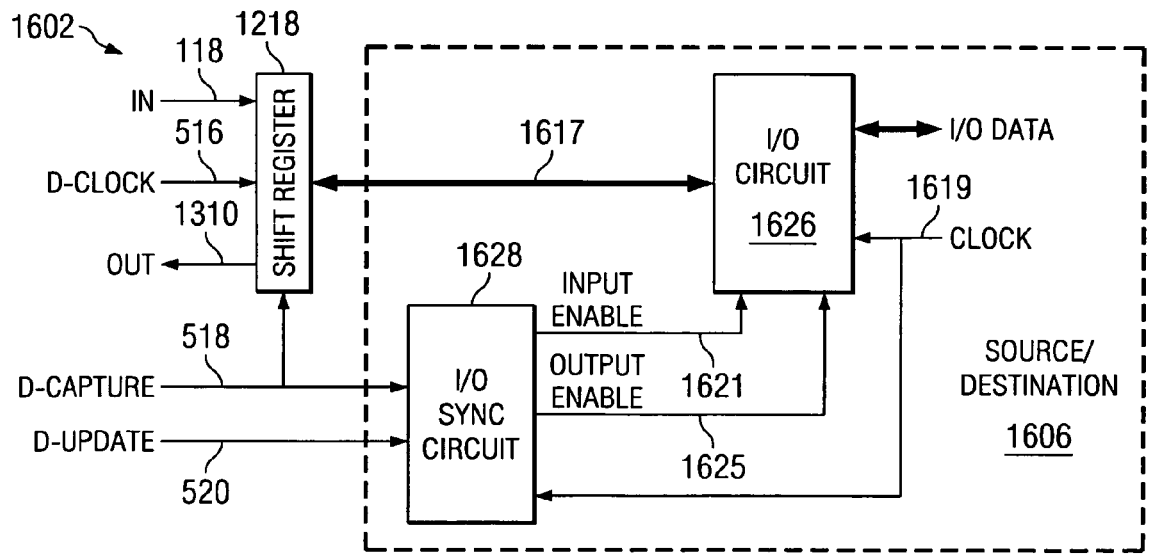
FIG. 16F illustrates the data register realized as the shift register of FIG. 12, and the I/O circuit realized as both a source output circuit and as a destination input circuit.
Figure 16G:
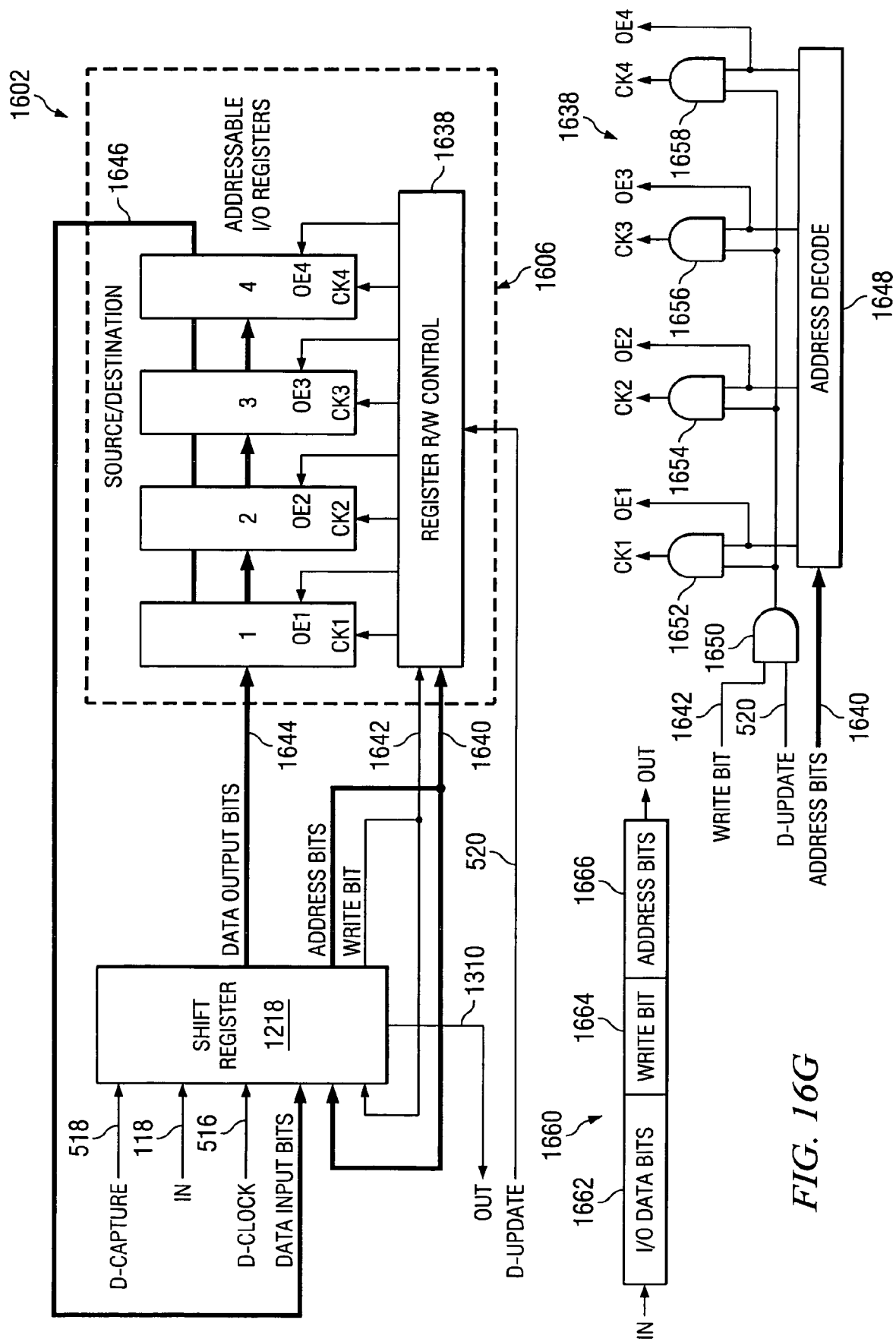
FIG. 16G illustrates an example data circuit design for providing the shift register of a data register to address one of four addressable I/O registers 1-4 existing as the general I/O circuitry of FIG. 16 and write and/or read data to the addressed I/O register.

As mentioned in regard to FIG. 12, the D-Update, D-Capture, and D-Clock signals may be input to the I/O circuitry 1606 to directly control or indicate when the I/O circuitry should input data from or output data to data register 1604. Following FIGS. 16A-16C illustrate how the D-Update, D-Capture, and D-Clock signals can directly control the I/O circuitry 1606. Following FIGS. 16D-16F illustrate how the D-Update, D-Capture, and D-Clock signals can indicate when to control an I/O operation to I/O circuitry 1606. Following FIG. 16G illustrates one example of I/O circuitry 1606 being directly controlled by the D-Update and D-Clock signals.

In FIG. 16A, the data register 1604 of data circuit 1602 is realized as the shift register 1218 of FIG. 12, and the I/O circuit 1606 of data circuit 1602 is realized as an destination input circuit 1612 for storing the output 1613 from shift register 1218 in response to the D-Update signal 520. Following the shifting of data into the shift register 1218, the D-Update signal will cause the input circuit 1612 to load the data and output the data as input data to another circuit. As seen in this example, the D-Update signal directly controls the input circuit 1612.

In FIG. 16B, the data register 1604 of data circuit 1602 is realized as the shift register 1218 of FIG. 12, and the I/O circuit 1606 of data circuit 1602 is realized as a source output circuit 1614 for capturing data from another circuit in response to the D-Clock and D-Capture signals and providing the captured data as input 1615 to the shift register 1218 during a subsequent D-Capture operation. During each D-Capture operation, the shift register 1218 and output circuit 1614 both capture data. The shift register 1218 captures the present data output from the output circuit 1614 and the output circuit 1614 captures the next data to be captured by the shift register during the next D-Capture operation. Following the capture operation, the shift register shifts the data out to Out signal 120. As seen in this example, the D-Capture signal directly controls the output circuit 1614 to capture data in response to the D-Clock signal.

In FIG. 16C, the data register 1604 of data circuit 1602 is realized as the shift register 1218 of FIG. 12, and the I/O circuit 1606 of data circuit 1602 is realized as both a source output circuit 1614 for inputting data to the shift register 1218 via bus 1617 and as a destination input circuit 1612 for storing data output from the shift register 1218 via bus 1617. The destination input circuit 1612 and source output circuit 1614 components of I/O circuit 1616 operate as described in FIGS. 16A and 16B. In this example, the D-Capture signal directly controls the output circuit 1614 of I/O circuit 1616 to capture data to be input to shift register 1218 in response to the D-Clock signal, and the D-Update signal directly controls the input circuit 1612 of I/O circuit 1616 to store data from shift register 1218.

In FIG. 16D, the data register 1604 of data circuit 1602 is realized as the shift register 1218 of FIG. 12, and the I/O circuit 1606 of data circuit 1602 is realized as an destination input circuit 1618 for storing the output from shift register 1218 via bus 1613. In this example, the input circuit 1618 is timed by a clock 1619 that is not synchronized to the D-Clock signal. In order for the input circuit to know when to store data from the shift register 1218 following a shift in operation, an input sync circuit 1620 is required. The input sync circuit inputs the D-Update signal and the clock signal 1619, and outputs an input enable signal 1621 to the input circuit. When the D-Update signal goes high at the end of a shift operation, the input sync circuit synchronizes the D-Update signal with the clock signal 1619 and outputs an input enable signal 1621 to the input circuit 1618. In response to the input enable signal, the input circuit is enabled to respond to clock signal 1619 to store the data output from the shift register 1218 on bus 1613. The input sync circuit 1620 is designed to output one synchronized input enable signal to the input circuit for each D-Update signal it receives, so only one data store occurs in input circuit 1618 for each occurrence of a D-Update signal. As seen in this example, the D-Update signal 520 indirectly controls the input circuit 1618 to store data output from the shift register by synchronizing the D-Update signal with the clock signal 1619.

In FIG. 16E, the data register 1604 of data circuit 1602 is realized as the shift register 1218 of FIG. 12, and the I/O circuit 1606 of data circuit 1602 is realized as a source output circuit 1622 for supplying data to the shift register 1218 via bus 1615. In this example, the output circuit 1622 is timed by a clock 1619 that is not synchronized to the D-Clock signal. In order for the output circuit 1622 to know when to fetch the next input data to be stored in shift register 1218 after the present data has been captured into the shift register, an output sync circuit 1624 is required. The output sync circuit inputs the D-Capture signal 518 and the clock signal 1619, and outputs an output enable signal 1625 to the output circuit. When the D-Capture signal goes high during a shift register 1218 capture operation, the output sync circuit synchronizes the D-Capture signal with the clock signal 1619 and outputs an output enable signal 1625 to the output circuit 1622 when the D-Capture signal returns low. By waiting until the D-Capture signal returns low to output the output enable signal 1625, the output circuit 1622 is prevented from loading the next data to be input to the shift register 1218 until after the shift register has captured the present data being output from the output circuit 1622. Following the capture operation, the data is shifted out of the shift register 1218 to the Out signal 120. The output sync circuit 1624 is designed to output one synchronized output enable signal 1625 to the output circuit for each D-Capture signal it receives, so only one data load occurs in the output circuit 1624 for each occurrence of a D-Capture signal. As seen in this example, the D-Capture signal 518 indirectly controls the output circuit 1622 to load data for input to the shift register by synchronizing the D-Capture signal with the clock signal 1619.

In FIG. 16F, the data register 1604 of data circuit 1602 is realized as the shift register 1218 of FIG. 12, and the I/O circuit 1626 of data circuit 1602 is realized as both a source output circuit 1622 for inputting data to the shift register 1218 via bus 1617 and as a destination input circuit 1618 for storing data output from the shift register 1218 via bus 1617. The destination input circuit 1618 and source output circuit 1622 components of I/O circuit 1626 operate as described in FIGS. 16D and 16E. To provide synchronization of the D-Update and D-Capture signals with the clock 1619 signal, an I/O sync circuit 1628 is provided. The I/O sync circuit 1628 incorporates both the input sync circuit 1620 and the output sync circuit 1624. The input sync circuit 1620 and output sync circuit 1624 components of I/O sync circuit 1628 operate as described in FIGS. 16D and 16E. In this example, the D-Capture signal indirectly controls the output circuit 1622 of I/O circuit 1626 to capture data to be input to shift register 1218 in response to the D-Clock signal, and the D-Update signal indirectly controls the input circuit 1618 of I/O circuit 1626 to store data from shift register 1218.

FIG. 16G illustrates an example data circuit 1602 design for providing the shift register 1218 of a data register 1604 to address one of four addressable I/O registers 1-4 existing as the general I/O circuitry of FIG. 16 and write and/or read data to the addressed I/O register. In this example the bit pattern 1660 of the shift register 1218 is partitioned into a first field 1662 for inputting and/or outputting data, a second field 1664 for outputting a write bit, and a third field 1666 for outputting address bits. The write 1642 and address 1640 bit outputs from the shift register 1218 are input to a register R/W control circuit 1638, along with the D-Update signal 520. The data output bits 1644 from the shift register are input to the data inputs of the I/O registers 1-4 and the data input bits 1646 from the I/O registers 1-4 are input to the shift register. The register R/W circuit 1638 controls the clocks (CK) and output enable (OE) inputs to the I/O registers 1-4. The register R/W circuit 1638 includes an address decode circuit 1648 for inputting and decoding the address bit inputs (2 in this example) and outputting output enables signals 1-4 to the I/O registers 1-4, clock gating circuits 1652-1658 for inputting the output enable signals 1-4 and the output of gate 1650 and outputting clock signal 1-4 to I/O registers 1-4. If the write bit is low (i.e. a read operation), gate 1650 will not pass the D-Update signal to gates 1652-1658. If the write bit is high (i.e. a write operation), gate 1650 will pass the D-Update signal to gates 1652-1658.

During an I/O register write operation, the shift register 1218 is shifted to load the data to be written, to set the write bit high, and to set the address bits to select the I/O register to be written. Following the shift operation, the D-Update signal 520 from the message controller 504 is activated which causes the addressed I/O register 1-4 to be clocked via gating 1652-1658 to load the data from the shift register via bus 1644. During a following capture, shift, and update operation, the data output from the addressed I/O is enabled (OE1-4) and is captured into the shift register via bus 1646 and shifted out while the next pattern is shifted in. During the above mentioned capture step, the existing write bit 1642 and address bit 1640 values are re-captured into the shift register since they are fed back to the shift register inputs. Data can be written to each of the other I/O registers 1-4 by repeating the above capture, shift, and update operations to the shift register.

During an I/O register read operation, the shift register 1218 is shifted to set the write bit low and to set the address bits to select the I/O register to be read. Following the shift operation, the D-Update signal 520 from the message controller 504 is activated, but since the write bit is low no I/O register 1-4 clocks are output from gates 1652-1658. During a following capture, shift, and update operation the data output from the addressed I/O register is enabled (OE1-4) and is captured into the shift register via bus 1646 and shifted out while the next pattern is shifted in. During the above mentioned capture step, the existing write bit 1642 and address bit 1640 values are re-captured into the shift register since they are fed back to the shift register inputs. Data from each of the other I/O registers 1-4 can be read by repeating the above capture, shift, and update operations to the shift register.

FIG. 17 illustrates an example of how the port and message reset controller 502 may be designed. The port and message reset controller 502 consists of two separate controllers, a port reset controller 1720 and a message reset controller 1722. The port reset controller 1720 consists of inverters 1702 and 1705, Or gate 1704, and flip flop pairs 1706 and 1708 connected as shown. Flip flop pairs 1706 and 1708 each include a rising edge clock flip flop feeding data to a falling edge flip flop, so it takes both a rising and falling clock edge to propagate an input to the pair to the output of the pair. The message reset controller 1722 consists of inverters 1710 and 1712, flip flop pairs 1714 and 1716, and And gate 1718 connected as shown. Again the flip flop pairs 1714 and 1716 include a rising edge clock flip flop feeding data to a falling edge clock flip flop. In response to a low input on the function reset input 134, flip flop pairs 1706 and 1708 are reset, which sets the port reset output 132 low and the message reset output 508 low, via And gate 1718. In response to the function reset 134 returning high, the port reset controller 1720 will remain in the reset state (port reset 132 output low) if the clock signal 106 is high and the In signal 118 is in a stable low or high state. The message reset controller flip flop pairs 1714 and 1716 are set while the clock signal is high.

During a message operation (i.e. an address and instruction message, or an address, instruction, and data message), the clock signal 106 is active, forcing the flip flop pairs of the port and message controller to be continuously forced to their set state due to the clock signal 106 being coupled to the set (S) input of the pair's flip flops. In the set state, the port and message controllers output highs on the port reset 132 and message reset 508 outputs, respectively. At the end of message operations, the port and message reset controllers may be reset by a special sequence applied on the clock signal 106 and In signal 118 (via data signal 104). The message reset controller 1722 is always reset following a message so that a new message may be initiated. The message reset output 508 of the message reset controller 1722 is used to force the message controller 504 of FIG. 5 to the shift address state 710 of FIG. 7 so that the next message will start from that state. The port reset message controller 1720 is reset whenever all messages operations have been performed and it is desired to force the 2 pin port into a reset state. The port reset output 132 resets the instruction circuit 112 to a known state and forces the message controller 504 to the shift address state 710 via the message reset output 508. A low on the above mentioned function reset signal 134 does the same thing, i.e. forces the message controller 504 to the shift address state 710 and initializes the instruction circuit 112.

Timing diagram 1802 of FIG. 18 illustrates the above mentioned special sequence applied on the clock 106 and In 118 signals which will reset the port reset controller and output a low on the port reset 132 and message reset 508 signals. The sequence includes the steps of holding the clock signal 106 high while inputting a clock pulse or pulses on the In signal 118. This port reset controller design example requires two clock pulses on the In signal 118 due to the choice of using two serially connected flip flop pairs 1706 and 1708. With clock signal 106 high, the rising and falling edges of the first clock pulse on In signal 118 sets the output of flip flop pair 1706 low (since clock signal 106 is high) and the rising and falling edges of the second clock pulse on In signal 118 sets the output of flip flop pair 1708 low, which forces the port reset 132 and message reset 508 signals low. The low on the port and message reset signals will be maintained until the clock signal 106 goes low, which sets the outputs of flip flop pairs 1706 and 1708 high and the port reset and message reset signals 132 and 508 high. As indicated in dotted line, if desired, additional clock signals can occur on the In signal 118 after the port reset controller 1720 has received the two clock pulses required to set the port reset signal 132 low.

Timing diagram 1804 of FIG. 18 illustrates the special sequence applied on the clock 106 and In 118 signals which will reset the message controller and output a low on the message reset 508 signal. The sequence includes the steps of holding the clock signal 106 low and inputting two clock pulses on the In signal 118. Like the port reset controller design example 1720 above, the message reset controller design example 1722 uses two serially connected flip flop pairs 1714 and 1716 for use with two clock pulses on the In signal 118. With clock signal 106 low, the rising and falling edges of the first clock pulse on In signal 118 sets the output of flip flop pair 1714 low and the rising and falling edges of the second clock pulse on In signal 118 sets the output of flip flop pair 1716 low, which forces the message reset 508 signal low. The low on the message reset signal will be maintained until the clock signal 106 goes high, which sets the outputs flip flop pairs 1714 and 1716 high and the message reset signal 508 high. As indicated in dotted line, if desired, additional clock signals can occur on the In signal 118 after the message reset controller 1722 has received the two clock pulses required to set the message reset signal 508 low.

While two clock pulses on In 118 and two flip flop pairs were used in the design examples of the port and reset controllers 1720 and 1722 above, a lesser or greater number of clock pulses and flip flop pairs may be used as well. A flip flop pair is required for each clock pulse used in the special sequence. The use of two clock pulses on In 118 and two flip flop pairs were used in these examples because it reduces the probability that noise or signal skew problems might produce the special sequences on clock 106 and In 118 during message operations that would force the port and message reset controllers to inadvertently enter their reset states and output lows on the port and message reset signals 132 and 508. The special port and message reset signaling sequences shown in the timing diagrams 1802 and 1804 of FIG. 18 are sequences that are never produced on the clock signal 106 and In signal 118 during message operations. These special sequences, when output by the 2 pin bus controller 302, are only detectable by the port reset 1720 and message reset 1722 controllers of the 2 pin bus target.

Figure 19:
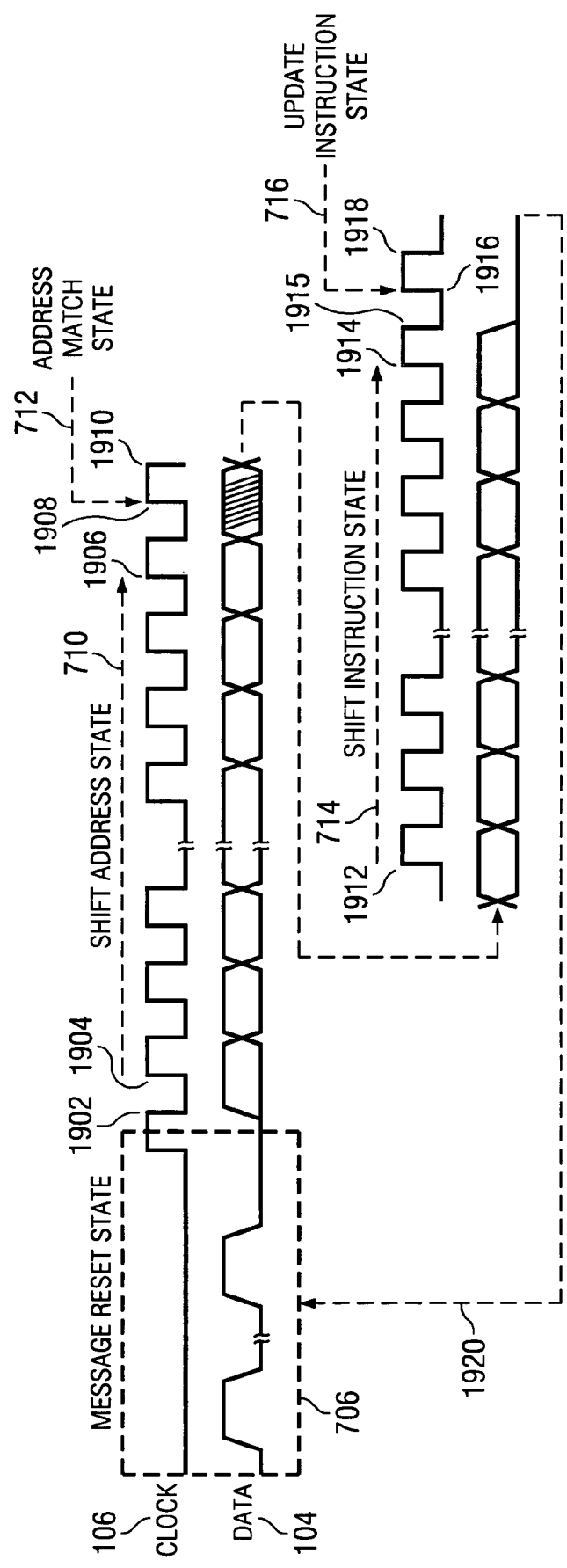
FIG. 19 illustrates a timing diagram.

FIG. 19 illustrates the timing on the clock 106 and data 104 signals to operate the port of a target to perform an address and instruction message operation. The timing displays the clock and data signals as they would appear on the clock and data wiring (or other forms of signal connections) between a port controller 302 and a target port 310, 312, 314. The target port states relate to the message controller state diagram of FIG. 7. Initially the target port of FIG. 19 is in the message reset state 706 with the clock signal wire low and pulses on the data signal wire. When the clock goes high, the port exits the message reset state 706 and removes the message reset condition (signal 508) on the message controller 504. With the message reset condition removed, the message controller 504 is enabled in the shift address state 710 and ready to shift in address data. When the clock returns low at 1902, the port controller outputs the first address data bit onto the data signal wire. The following rising edge of the clock at 1904 clocks the first address bit into the address circuit 110.

Figure 20:
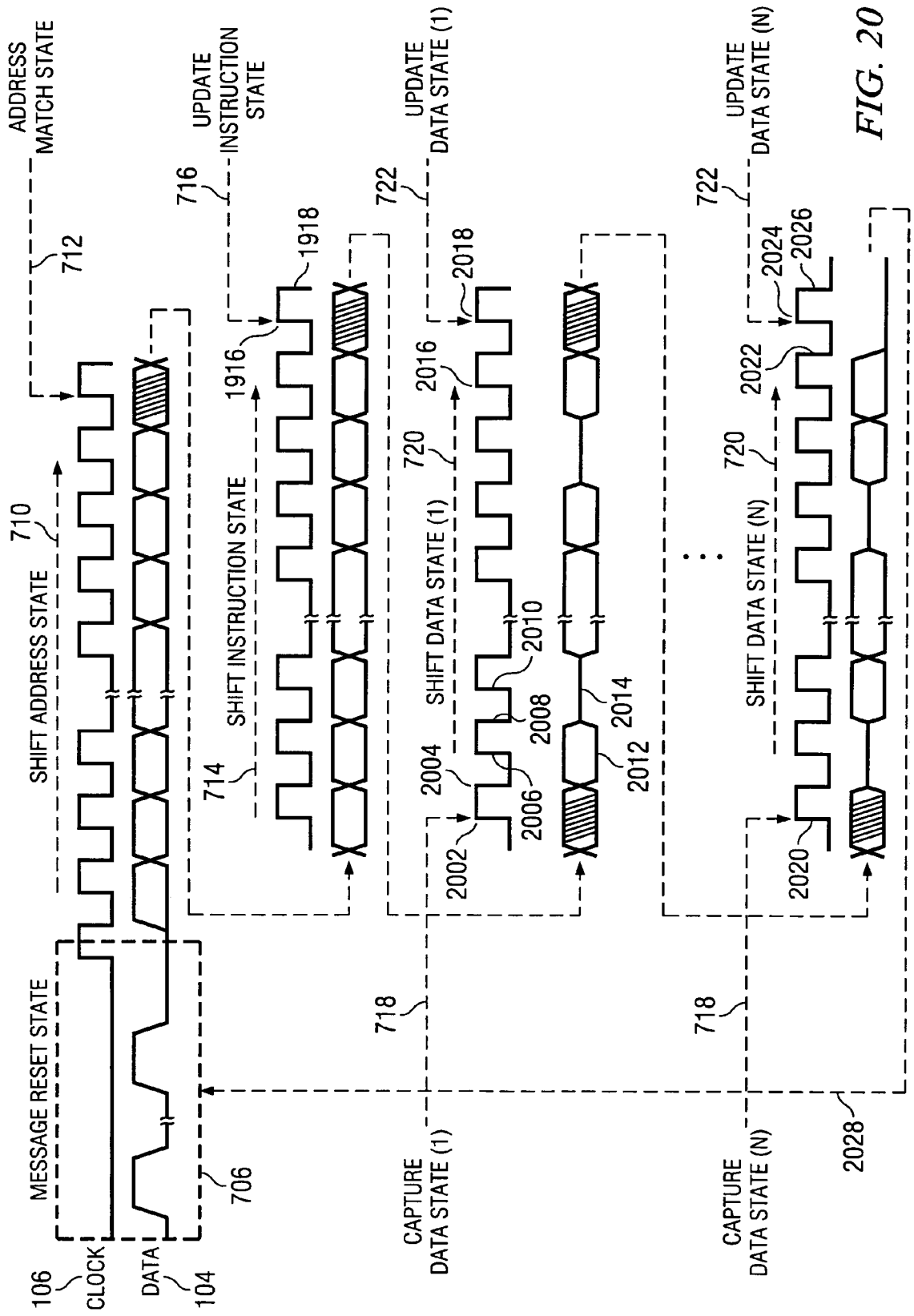
FIG. 20 illustrates a timing diagram.

During the shift address state 710, additional address bits are output from the controller on the falling edge of the clock and shifted into the address circuit 110 on the rising edge of the clock up to and including the last address bit on rising clock edge 1906. On rising edge 1908, the message controller evaluates the address for a match in address match state 712. During rising edge 1908, the value on the data wire is a don't care as indicated in FIGS. 19 and 20 by slash lines. It is assumed the address matches, so the message controller enters the shift instruction state 714.

On rising edge 1912, the message controller shifts in the first instruction bit from the port controller to the instruction circuit 112. The instruction bit shift in operation continues until the last instruction bit is shifted into the instruction circuit on the rising clock edge 1914. On falling clock edge 1915, the port controller sets the data wire low to prepare for issuing the special clock and data sequence to return to the message reset state 706 at time 1920. On rising clock edge 1916, the message controller updates the instruction circuit outputs in update instruction state 716 to enable the instruction. The port controller sets the clock wire low at 1918.

At time 1920, the port controller issues the special sequence on the clock and data wire to cause the target port to return to the message reset state 706, which resets the message controller 504 and terminates the address and instruction message operation. The above described address and instruction message operation can be repeated as needed to individually address and input instructions to target ports. If the address shifted in is the global port address mentioned in regard to FIGS. 3 and 10, all target ports will be addressed to input and update the instruction.

FIG. 20 illustrates the timing on the clock 106 and data 104 signals to operate the port of a target to perform an address, instruction and data message operation. From the message reset state 706 to the update instruction state 716, the address and instruction timing occurs as described above in FIG. 19. Since data is to be communicated following the update of the instruction, the port controller does not issue the special sequence to enter the message reset state 706 as it did in FIG. 19, but rather continues to operate the data and clock signal wires following update instruction state 716.

During the capture data state 718 parallel data to be sent to the port controller via the data signal wire 104 is captured into the data circuit 1112 selected by the instruction on rising clock edge 2002. During the falling clock edge 2004 of the shift data state 720 the output enable signal 416 from message controller 504 goes high, as shown in FIG. 8. The high on output enable signal 416 causes the data I/O circuit 402 to switch from being a unidirectional data input circuit to being a bidirectional data input and output circuit, as described in FIGS. 4, 7, and 8.

The details of how the data I/O circuit operates to simultaneously input and output data on the data signal wire 104 will be described in detail later in regard to FIGS. 25-28. For now, let it simply be said that when both the port controller and the target port are outputting the same logic level voltages, high or low, the wire will be set to that logic level voltage, and when the port controller and target port are outputting opposite logic level voltages the wire will be set to a voltage that lies between the opposite logic level voltages, say a middle (mid) voltage.

On the falling clock edge 2004 of the shift data state 720 both the port controller and target port output first data signals onto data signal wire 104. As seen, the first data signal 2012 on the data wire is either high or low, which means that the data signals output from the port controller and target port or both either high or low, respectively. On rising clock edge 2006 both the port controller and the target port input the data signal 2012. The data signal 2012 indicates, by virtue of its logic level, the data being output from the port controller to the target port and the data being output from the target port to the port controller. On the falling clock edge 2008, the port controller and target port output second data signals onto data signal wire 104.

As seen, the second data signal 2014 on the data wire is at a mid voltage, which means that the data signals output from the port controller and target port are at opposite logic levels. On the rising clock edge 2010, the port controller and the target port input data based on the mid point voltage signal 2014 and the data each was attempting to output.

For example if the target port was outputting a logic high and the wire is at a mid point voltage, the target port will know that the port controller was outputting a logic zero, which caused the wire to be at a mid point voltage, and will input a logic zero to the selected data circuit 1112 on rising clock edge 2010. Similarly, if the port controller is outputting a logic low and the wire is at a mid point voltage, the port controller will know that the target port was outputting a logic high and will input a logic high. The bidirectional data transfer between the port controller and the target port continues while the target port is in the shift data state 720. On rising clock edge 2016 the last data is transferred between the port controller and the target port and the message controller 504 of the target port enters the update data state 722. In the update data state, the output enable signal 416 from the message controller 504 to the data I/O circuit 402 is set low to cause the data I/O circuit to switch from operating in the bidirectional data transfer mode to the unidirectional input mode. On rising edge 2018 of the update data state 722 the data shifted into the selected data circuit 1112 is updated to the data circuit's parallel outputs.

The sequence from the rising clock edge 2002 to the rising clock edge 2018 defines the first capture (1), shift (1), and update (1) operations of the first data frame transferred between the port controller and the target port. Additional data frames may follow the first data frame. The sequence from the rising clock edge 2020 to the rising clock edge 2024 defines the last capture (N), shift (N), and update (N) operations of the last data frame transferred between the port controller and the target port. After the last data frame (N) is transferred, the port controller sets the data signal wire low on falling edge 2022 and sets the clock wire low at 2026. At time 2028, the port controller issues the special sequence on the clock and data wire to cause the target port to return to the message reset state 706, which resets the message controller 504 and terminates the address, instruction, and data message operation. The above described address, instruction, and data message operation can be repeated as needed to individually address a target port, input an instruction to the target port, and perform a data I/O operation to the target port.

Figure 21:
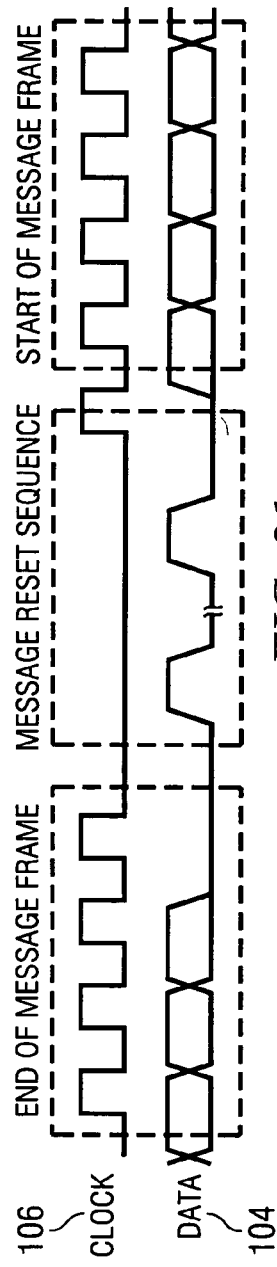
FIG. 21 illustrates a timing diagram.

FIG. 21 illustrates a timing diagram depicting the end of a message frame, the issuance of a message reset sequence, and the start of a new message frame.

Figure 22:
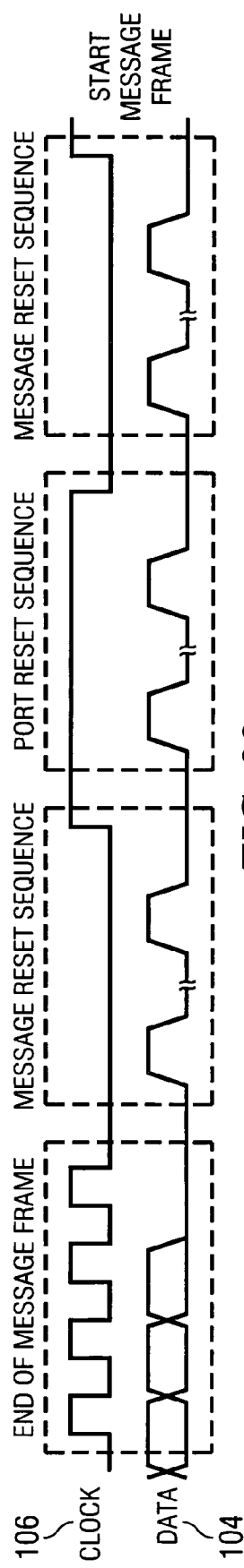
FIG. 22 illustrates a timing diagram.

FIG. 22 illustrates a timing diagram depicting the end of a message frame, the issuance of a message reset sequence, the issuance of a port reset sequence, and the issuance of a message reset sequence.

Figure 23:
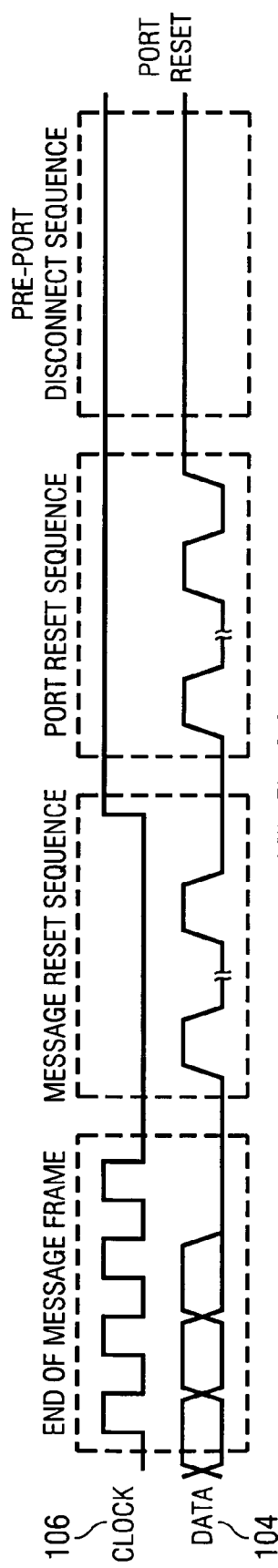
FIG. 23 illustrates a timing diagram.

FIG. 23 illustrates a timing diagram depicting the end of a message frame, the issuance of a message reset sequence, the issuance of a port reset sequence, and the issuance of a pre-port disconnect sequence. The pre-port disconnect sequence is used to set the clock 106 and data 104 signals high prior to disconnecting the port controller from the target port. The clock and data signals will remain high when the port controller is disconnected by the pull up elements 116 shown in FIG. 1.

Figure 24:
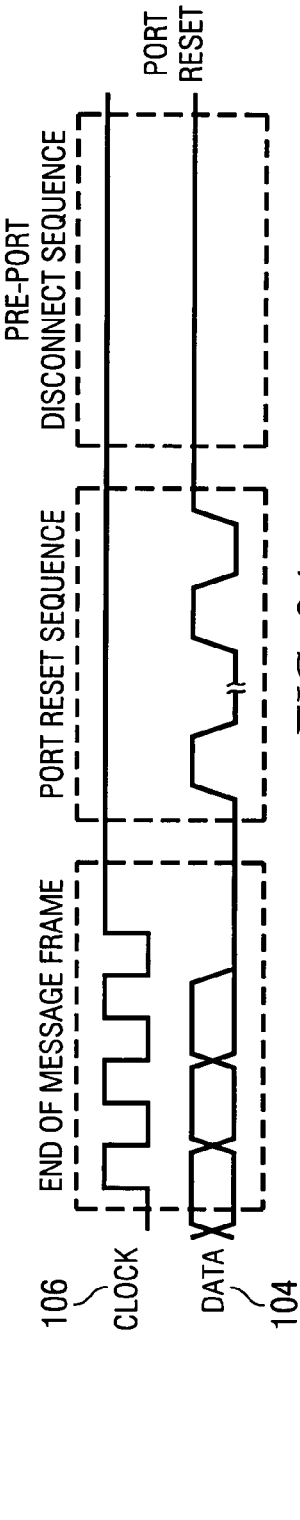
FIG. 24 illustrates a timing diagram.

FIG. 24 illustrates a timing diagram depicting the end of a message frame, the issuance of a port reset sequence, and the issuance of a pre-port disconnect sequence. This timing diagram indicates that the port reset sequence may be issued immediately following a message frame if desired.

While the timing diagrams in FIGS. 19-24 have shown the port controller and target port inputting data from the data signal wire on one edge of clock signal 106 and outputting data to the data signal wire on the opposite edge of clock signal 106, it should be understood that the port controller and target ports could be designed to input and output data on the same clock edge if desired. Also, while the certain static logic levels were used on the clock signal 106 during the special sequences for message reset (clock=low) and port reset (clock=high), the special sequences may be defined using opposite static logic levels on the clock signal as well.

Figure 25:
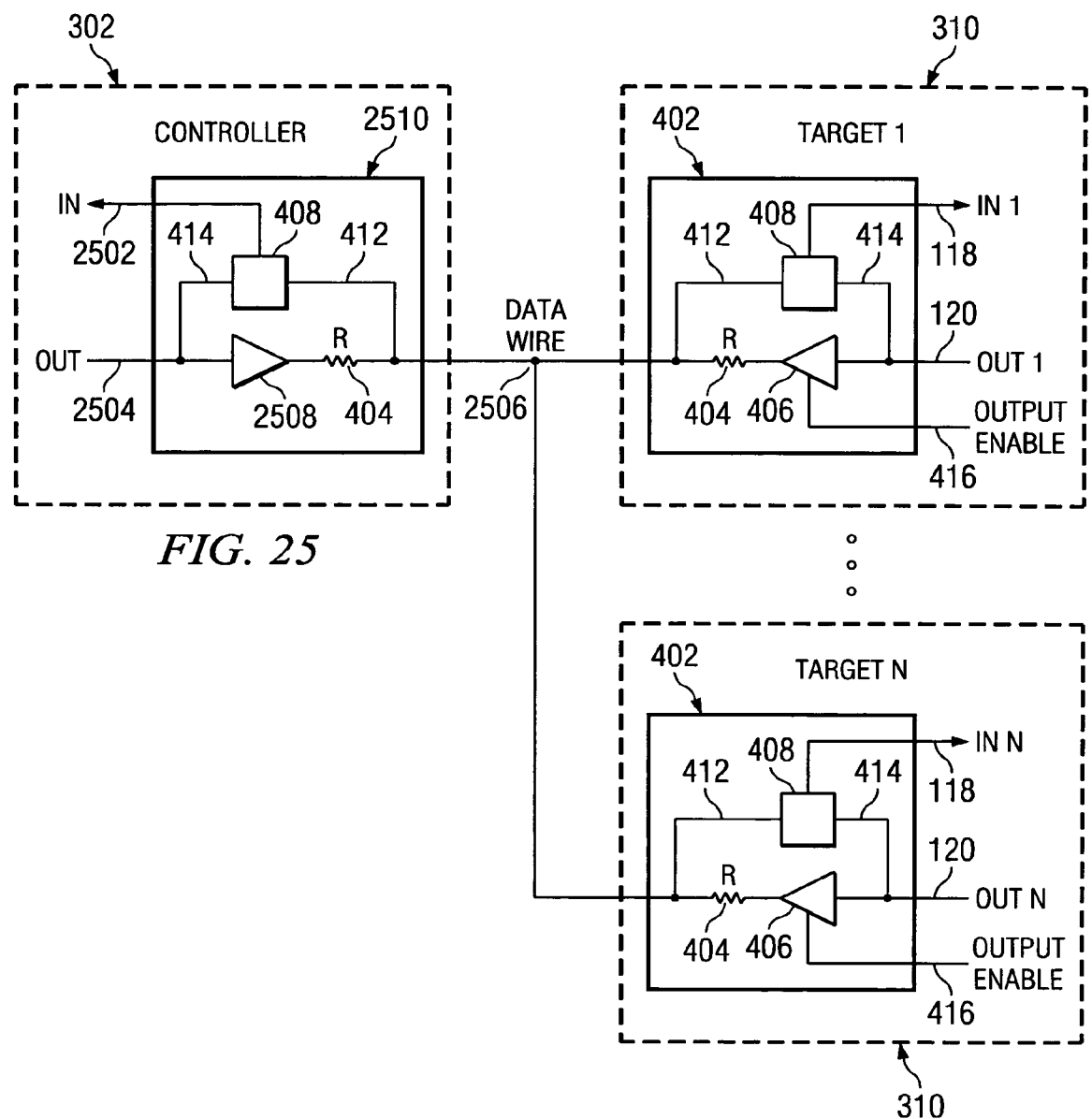
FIG. 25 illustrates the data signal wire connection between the data I/O circuit of a port controller and data I/O circuits of 1-N target circuits.

FIG. 25 illustrates the data signal wire connection 2506 between the data I/O circuit 2510 of a port controller 302 and data I/O circuits 402 of 1-N target circuits 310. Preferably, the output buffer 2508 of the port controller data I/O circuit 2510 and the output buffers 406 of the target circuit data I/O circuits 402 will have approximately the same current sink/source drive strength. Also preferably the resistors 404 of the port controller and target circuit data I/O circuits will have approximately the same resistance. As seen the output buffer 2508 of the port controller's data I/O circuit is always enabled to output data to the target ports, while the output buffers 406 of the target port data I/O circuits are selectively enabled and disabled by the output enable signal 416 from the message controller 504. The In1-In N signals 118 of the target port data I/O circuit 402 are coupled to the serial data inputs of the target port's address 110, instruction 112, and data 114 circuits as previously described. The Out1-Out N signals 120 of the target port data I/O circuit 402 are coupled to the serial data output of the data circuits 114 as previously described. The In signal 2502 of the port controller's data I/O circuit 2510 is coupled to a circuit within the port controller designed to receive serial data input signals from data signal wired 2506, and the Out signal 2504 of the port controller's data I/O circuit 2510 is coupled to a circuit within the port controller designed to transmit serial data output signals to data signal wire 2506.

During address and instruction shift operations, the output buffers 406 of the target circuits 310 are disabled, providing the output buffer 2506 of the port controller to be the sole driver of the data signal wire 2506. During address shift operations, the input circuit 408 of the target circuits operates as an input buffer to pass the address data from the port controller to the In1-N signals 118. During instruction shift operations, the input circuit 408 of the addressed target circuit continues to operate as an input buffer to pass instruction data from the port controller to the In1-N signals 118.

During data shift operations, the output buffer 406 of the selected (addressed) target circuit is enabled via the output enable signal 416, providing both the output buffer 2506 of the port controller and the output buffer 406 of the selected target port to source data onto data signal wire 2506. If the port controller output buffer 2508 and target port output buffer 406 both output the same logic level to the data signal wire 2506, the data signal wire will be at that logic level. If the port controller output buffer 2508 and the target port output buffer 406 output opposite logic levels, the data signal wire will be at a mid point voltage level between the two opposite logic levels. When the output buffers 2508 and 406 are driving the data signal wire 2506 with opposite logic levels, the resistors 404 serve to limit the current flow between the two output buffers and serve as voltage droppers to provide the mid point voltage level on data signal wire 2506 to be more easily detected by the data input circuits 408 as a voltage level that is distinctly different than the normal logic level voltage level output from the output buffers 2506 and 406.

Figure 26:
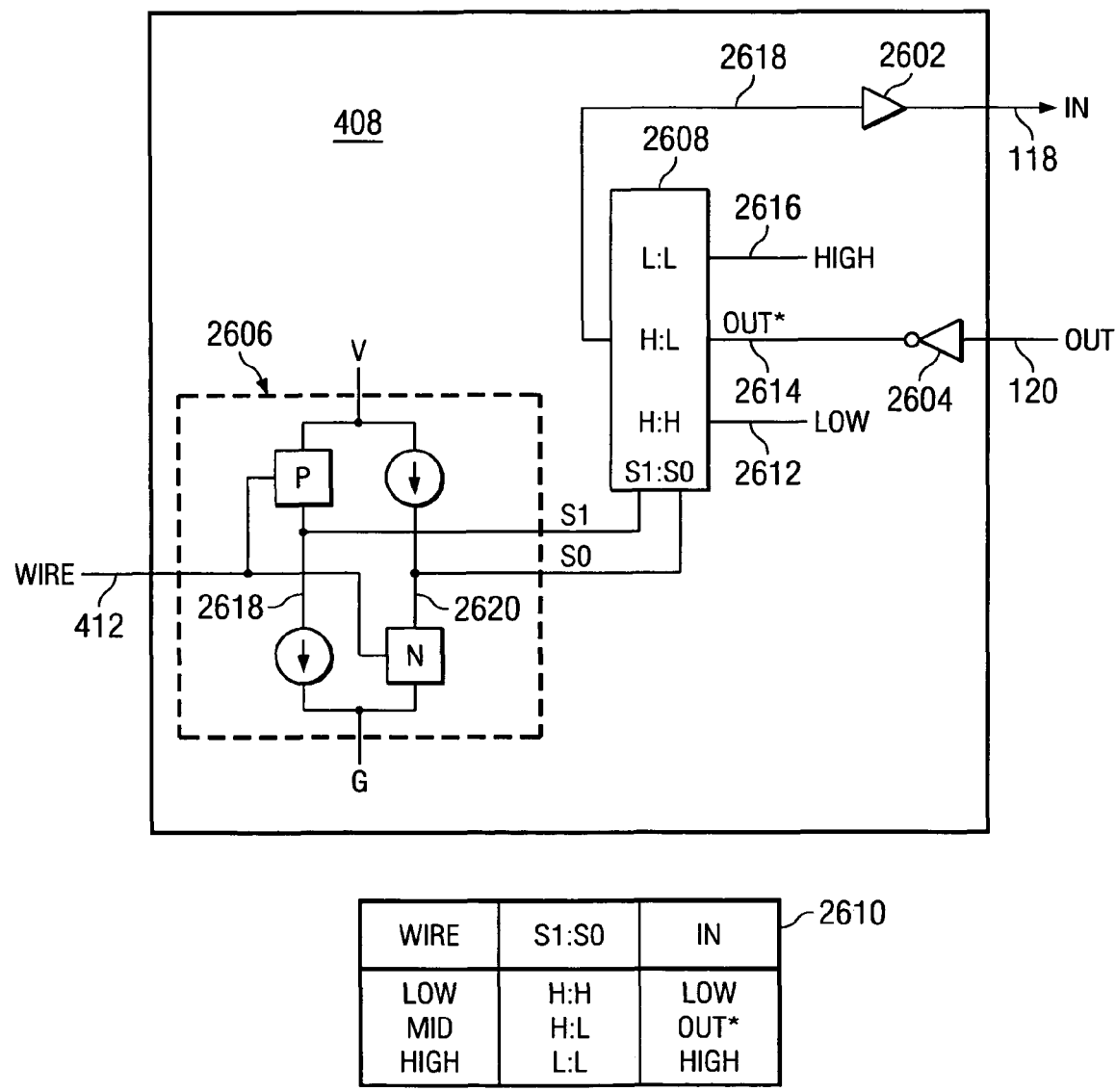
FIG. 26 illustrates one example implementation of the data input circuit of the data I/O circuits.

FIG. 26 illustrates one example of how to design the data input circuit 408 of the data I/O circuits 2510 and 402. The data input circuit 408 includes a voltage comparator circuit 2606, multiplexer 2608, an inverter 2604, and a buffer 2602. The voltage comparator circuit 2606 inputs voltages from the data wire signal 2506 via connection 412 and outputs digital control signals S0 and S1 to multiplexer 2608. As seen, the first voltage (V) to ground (G) leg 2618 of voltage comparator circuit 2606 comprises a series P-channel transistor and current source and the second voltage to ground leg 2620 comprises a series N-channel transistor and current source. As seen, S1 is connected at a point between the P-channel transistor and current source of the first leg 2618 and S0 is connected at a point between the N-channel transistor and current source of the second leg 2620. The gates of the transistors are connected to wire input connection 412 to provide voltages on the data signal wire 2506 to turn the transistors on and off.

The operation of the voltage comparator circuit 2606 and multiplexer 2608 is shown in table 2610 and is described herein. If the voltage on wire connection 412 is at a low level (logic zero), the S0 and S1 outputs are set high, which causes the multplexer 2608 to select its low input 2612 and output the low input to In 118 via connection 2618 and buffer 2602. If the voltage on wire connection 412 is at a mid level (mid point voltage), the S0 is set low and the S1 is set high, which causes the multplexer 2608 to select its Out*input 2614 (inverted Out signal 120) and output the Out*input to In 118 via connection 2618 and buffer 2602. If the voltage on wire connection 412 is high (logic one), the S0 and S1 outputs are set low, which causes the multiplexer 2608 to select its high input 2616 and output the high input to In 118 via connection 2618 and buffer 2602.

Figure 27A:
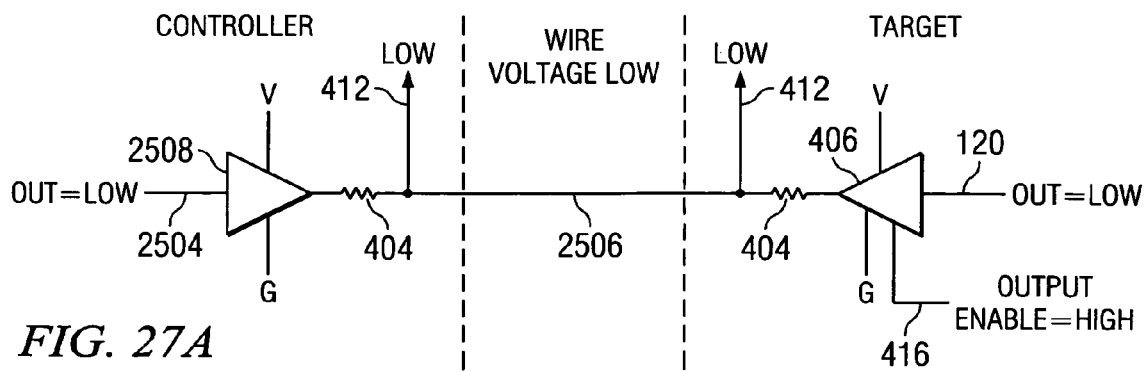
FIG. 27A illustrates the case where the port controller output buffer and target port output buffer are both outputting logic lows to data signal wire.

FIG. 27A illustrates the case where the port controller output buffer 2508 and target port output buffer 406 are both outputting logic lows to data signal wire 2506. In this case the data signal wire is low and the wire 412 input to the data input circuits 408 of the port controller and target port is low. This causes; (1) the data input circuit 408 of the port controller to input a low to the port controller on In signal 2502 and (2) the data input circuit 408 of the target port to input a low to the target port on In signal 118.

Figure 27B:
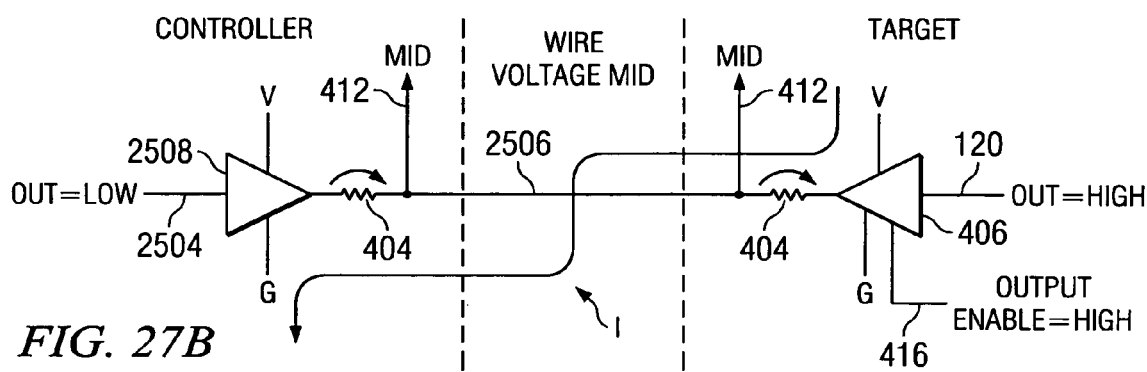
FIG. 27B illustrates the case where the port controller output buffer is outputting a low on data signal wire and target port output buffer is outputting a high on data signal wire.

FIG. 27B illustrates the case where the port controller output buffer 2508 is outputting a low on data signal wire 2506 and target port output buffer 406 is outputting a high on data signal wire 2506. In this case a current path exists from the high voltage output (V) from buffer 406 to the low voltage output (G) from buffer 2508. The resistors 404 limit the current flow and the voltage drops across them produce a distinctly detectable mid point voltage level on the data signal wire 2506. The mid point voltage level on the data signal wire is input to the data input circuits 408 of the port controller and target port, via connections 412. Since the data input circuit 408 of the port controller knows the port controller was outputting a logic low, it responds to the mid point voltage by inputting a logic high to the port controller on In signal 2502, which is the only voltage that can be output from the target port buffer 406 to cause the mid point voltage on data signal wire 2506. Similarly, since the data input circuit 408 of the target port knows the target port was outputting a logic high, it responds to the mid point voltage by inputting a logic low to the target port on In signal 118, which is the only voltage that can be output from the port controller buffer 2508 to cause the mid point voltage on data signal wire 2506.

Figure 27C:
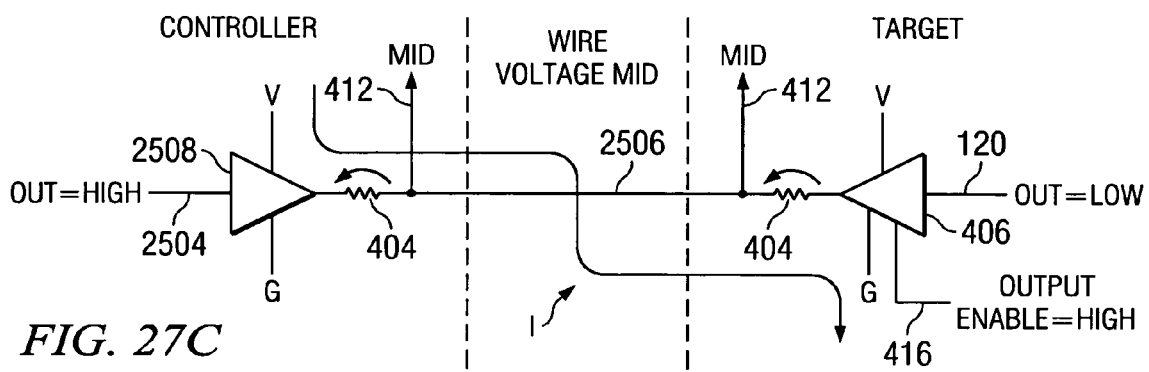
FIG. 27C illustrates the case where the port controller output buffer is outputting a high on data signal wire and target port output buffer is outputting a low on data signal wire.

FIG. 27C illustrates the case where the port controller output buffer 2508 is outputting a high on data signal wire 2506 and target port output buffer 406 is outputting a low on data signal wire 2506. In this case a current path exists from the high voltage output (V) from buffer 2508 to the low voltage output (G) from buffer 406. Again, the resistors 404 limit the current flow and the voltage drops across them produce a distinctly detectable mid point voltage level on the data signal wire 2506. The mid point voltage level on the data signal wire is input to the data input circuits 408 of the port controller and target port, via connections 412. Since the data input circuit 408 of the target port knows the target port was outputting a logic low, it responds to the mid point voltage by inputting a logic high on In signal 118 to the target port, which is the only voltage that can be output from the port controller buffer 2506 to cause the mid point voltage on data signal wire 2506. Similarly, since the data input circuit 408 of the port controller knows the port controller was outputting a logic high, it responds to the mid point voltage by inputting a logic low to the port controller on In signal 2502, which is the only voltage that can be output from the target port buffer 406 to cause the mid point voltage on data signal wire 2506.

Figure 27D:
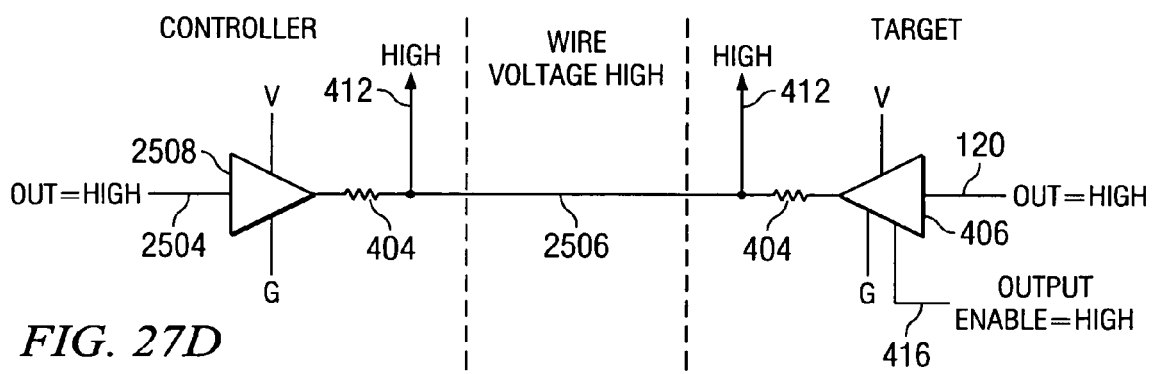
FIG. 27D illustrates the case where the port controller output buffer and target port output buffer 406 are both outputting logic highs to data signal wire.

FIG. 27D illustrates the case where the port controller output buffer 2508 and target port output buffer 406 are both outputting logic highs to data signal wire 2506. In this case the data signal wire is high and the wire 412 input to the data input circuits 408 of the port controller and target port is high. This causes; (1) the data input circuit 408 of the port controller to input a high to the port controller on In signal 2502 and (2) the data input circuit 408 of the target port to input a high to the target port on In signal 118.

Figure 28:
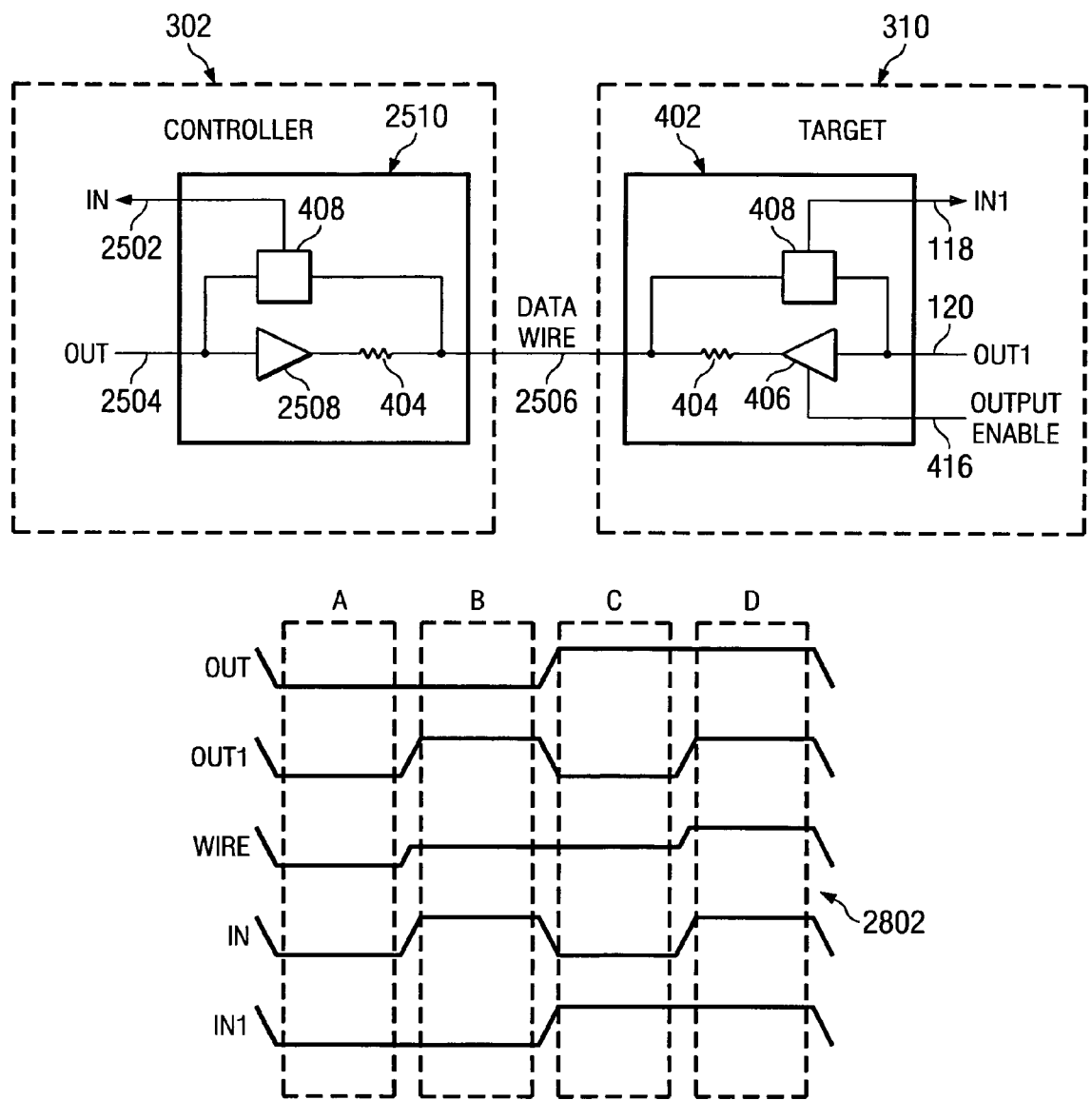
FIG. 28 illustrates timing waveforms.

FIG. 28 illustrates timing waveforms 2802 for the four cases (A,B,C,D) in which simultaneous data communication occurs between a port controller 302 and a selected (output enable signal is high) target port 310, via data signal wire 2506. Each case A-D is indicated in the timing diagram by vertical dotted line boxes.

Figure 29:
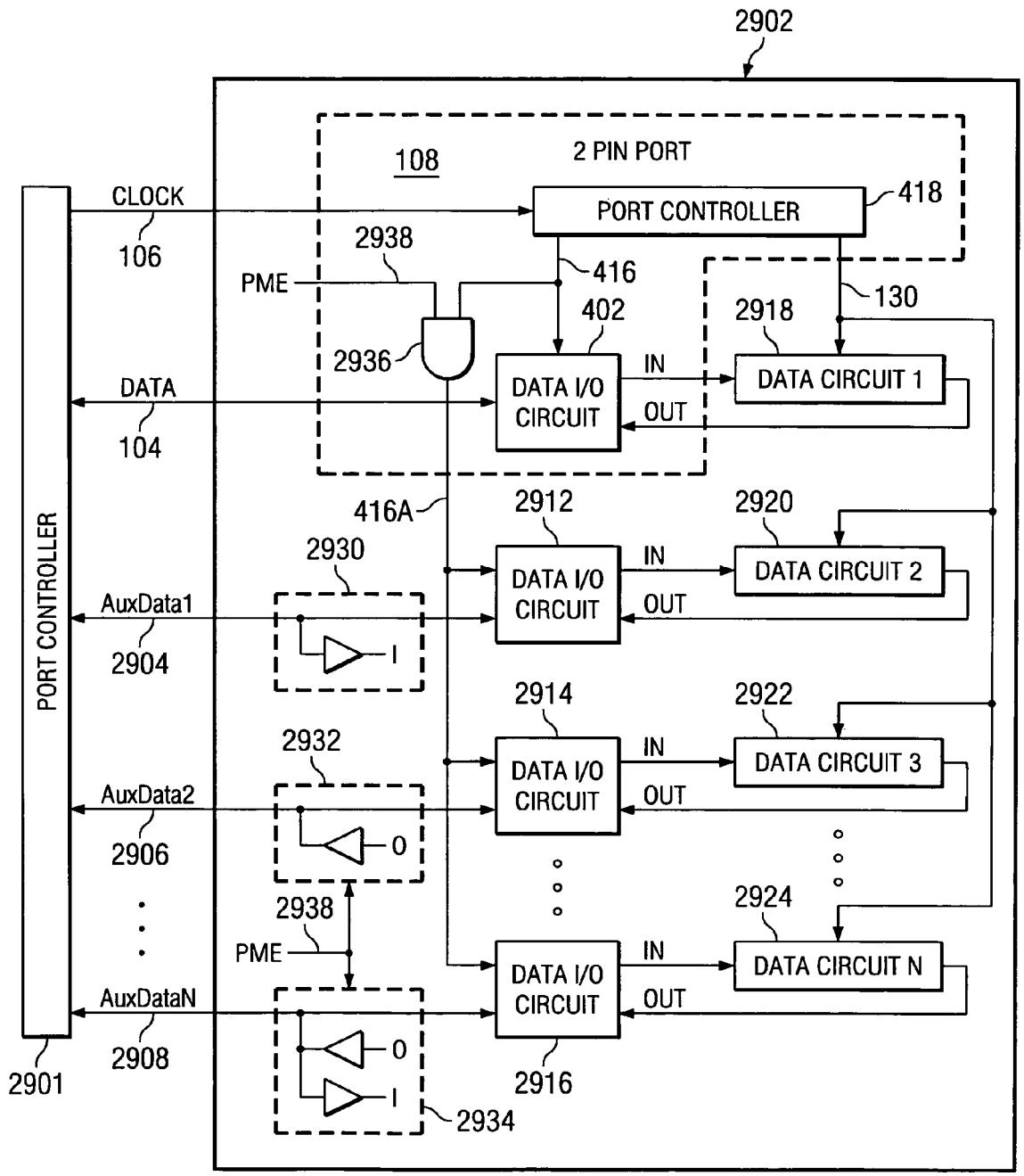
FIG. 29 illustrates an example implementation of the two pin port in a device (IC or core) extended to include auxiliary data signals to increase the data input and output bandwidth between the device and an external port controller.

FIG. 29 illustrates how the 2 pin port in a device (IC or core) 2902 may be extended to include auxiliary data signals 2904-2908 to increase the data input and output bandwidth between the device 2902 and an external port controller 2901. For simplification, the address 110 and instruction 112 circuits are not shown in FIG. 29. As seen, the device includes the 2 pin port 108 which includes the data I/O port 402 and the port controller 418. The external port controller 2901 is connected to the 2 pin port's data I/O port 402 via data signal 104 and to the 2 pin port's controller 418 via the clock signal 106 as previously described. The device includes auxiliary data I/O circuits (402) 2912-2916, one for each auxiliary data signal 2904-2908. The external controller 2901 is connected to each auxiliary data I/O circuit 2912-2916 via an auxiliary data signal 2904-2908. The external controller 2901 includes a data I/O circuit 2510 for each auxiliary data signal 2904-2908 to provide bidirectional data communication to the auxiliary data I/O circuits 2912-2916 of device 2902 as described in FIGS. 25-28 for the data signal 104.

The 2 pin port may operate with the external controller 2901 using only the clock 106 and data 104 signals as previously described, or it may operate with the external controller 2901 using the clock 106, data 104, and auxiliary data signals 2904-2908. The instruction shifted into the instruction circuit 112 (not shown) will determine whether the 2 pin port operates in single data I/O mode using only data signal 104 or operates in parallel data I/O mode using data signal 104 and the auxiliary data signals 2904-2908. As can be understood, the parallel data I/O mode significantly increases the data bandwidth between the device 2902 and controller 2901 over that possible in the single data I/O mode.

When operating in the parallel data I/O mode, the data I/O circuits 402 and 2912-2916 of the data signal 104 and auxiliary data signals 2904-2908 are coupled, in response to an instruction, to selected data circuits (1112) 2918-2924, such that the data circuits may input data from the In signal output of the data I/O circuits and output data to the Out signal input of the data I/O circuits. While not shown, the output data from the data circuits 2918-2924 to the Out signal input of the data I/O circuits 402 and 2912-2916 will be timed on the falling edge of the clock 106 signal by a flip flop (like flip flop 1312) as described in FIG. 13.

During parallel data I/O mode, the data I/O circuit 402 is enabled by the output enable signal 416 of port controller 418, the data I/O circuits 2912-2916 are enabled by the output enable signal 416A from And gate 2936, and the data circuits 2918-2924 are controlled to capture, shift, and update by appropriate D-Capture 518, D-Clock 516, and D-Update 520 control signals on DC bus 130. During the parallel data I/O mode, the data circuits 2918-2924 will be controlled by the port controller 418 to capture data in the capture state 718, shift data in the shift state 720, and update data in the update state 722. The data appearing on the wiring of the data signal 104 and auxiliary data signals 2904-2908 between controller 2901 and device 2902 during the data capture, shift, and update operations is the same as shown in the timing diagram of FIG. 20. This capture, shift, and update sequence are repeated as necessary to perform a parallel data I/O operation between the controller 2901 and device 2902. As previously described, the clock signal 106 and data signal 104 are used to issue the message reset sequence to the port controller 418 which terminates the parallel data I/O operation mode.

The auxiliary data signals 2904-2908 of a device may be dedicated signals or they may be signals shared with other signals of the device, such as functional signals. For example in an IC or core device, the auxiliary data signals 2904-2908 of data I/O circuits 2912-2916 may have their own dedicated external device terminals or the auxiliary data signals of the data I/O circuits may share external device terminals with other circuits 2930-2934 using the terminals for input, output, or I/O operations.

If the device terminals are shared, a parallel mode enable (PME) signal 2938 from instruction output bus 128 determines whether the terminals are used by the data I/O circuits 2912-2916 or by the other circuits 2932-2934. If the output terminals are to be used by the other circuits, an instruction will be loaded that sets the PME signal 2938 low, which enables the other circuits to use the terminals and forces the output enable signal 416A from And gate 2938 low. While PME is low, the output enable signal 416 from the port controller 418 can enable data I/O circuit 402 to operate in the bidirectional data mode, but cannot enable data I/O circuits 2912-2916 to operate in the bidirectional data mode, i.e. data I/O circuits 2912-2916 remain in the input only mode. If the output terminals are to be used by the data I/O circuits 2912-2916, an instruction will be loaded that sets the PME signal 2938 high, which disables the other circuits 2932-2934 from using the terminals and enables the output enable signal 416A to be driven by the output enable signal 416 from the port controller 418. With output enable signal 416 driving output enable signal 416A the data I/O circuits 2912-2916 operate in the bidirectional data mode whenever data I/O circuit 402 operates in the bidirectional data mode.

From the above it is seen that when the PME signal 2938 is low, the device communicates data to and from the controller 2901 using only the clock 106 and data 104 signals, but when the PME signal 2938 is high, the device communicates data to and from the controller 2901 using the clock 106, data 104, and auxiliary data 2904-2908 signals. Thus the PME signal selectively enables either single or parallel data I/O modes of the present invention. If it is determined that only parallel data I/O modes are used and the device terminals are dedicated for use only by the auxiliary data signals 2904-2908 only, the PME signal 2938 and And gate 2936 can be eliminated from FIG. 29 and the output enable signal 416 from port controller 418 can be directly connected to signal 416A. This provides data I/O circuit 402 and data I/O circuits 2912-2916 to always operate together during bidirectional data I/O operations.

Figure 30:
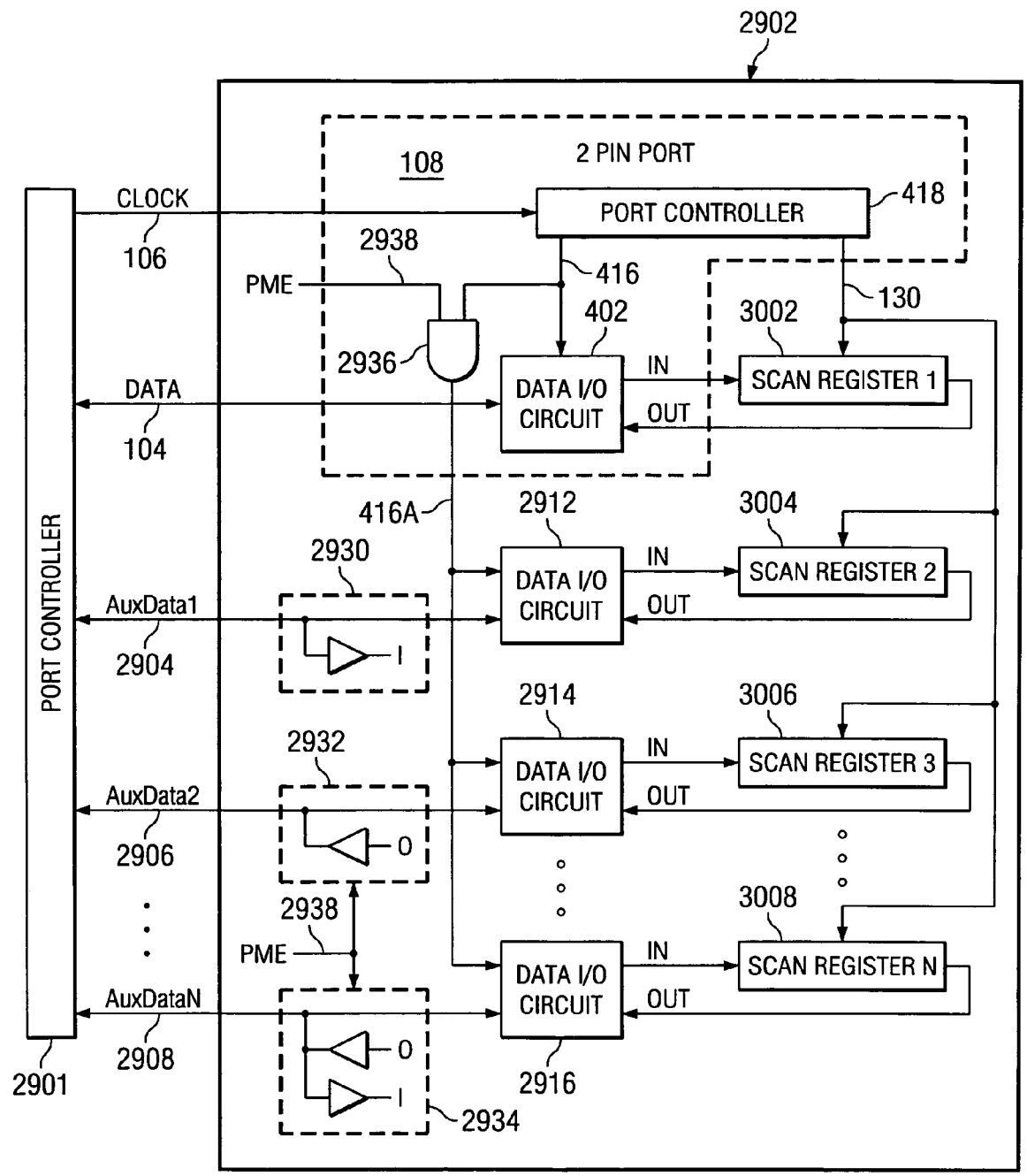
FIG. 30 illustrates the IC or core device wherein the data circuits selected by an instruction for a parallel data I/O operation are scan registers 1-N used for testing.

FIG. 30 illustrates the IC or core device 2902 wherein the data circuits (1112) 3002-3008 selected by an instruction for a parallel data I/O operation are scan registers 1-N used for testing. The scan registers 1-N could be the internal scan registers 1404 of FIG. 14, the boundary scan registers 1504 of FIG. 15, or a combination of internal scan registers 1404 and boundary scan registers 1504. An important scan test improvement, enabled by the present invention and shown in FIG. 30, is that during scan testing each scan register 3002-3008 inputs test stimulus data from the port controller 2901 and outputs test response data to port controller 2901, via a single data signal wire 104, 2904-2908. Conventional device (IC or core) scan registers require two data signal wires for scan testing, a first signal wire for inputting test stimulus data from the tester (port controller 2901) and a second signal wire for outputting test response data to the tester. Thus the present invention provides the advantage of performing scan data input and output to the scan registers of a device using only one data wire per scan register. This advantageously reduces the number of connections between a device under test and the tester.

Figure 31:
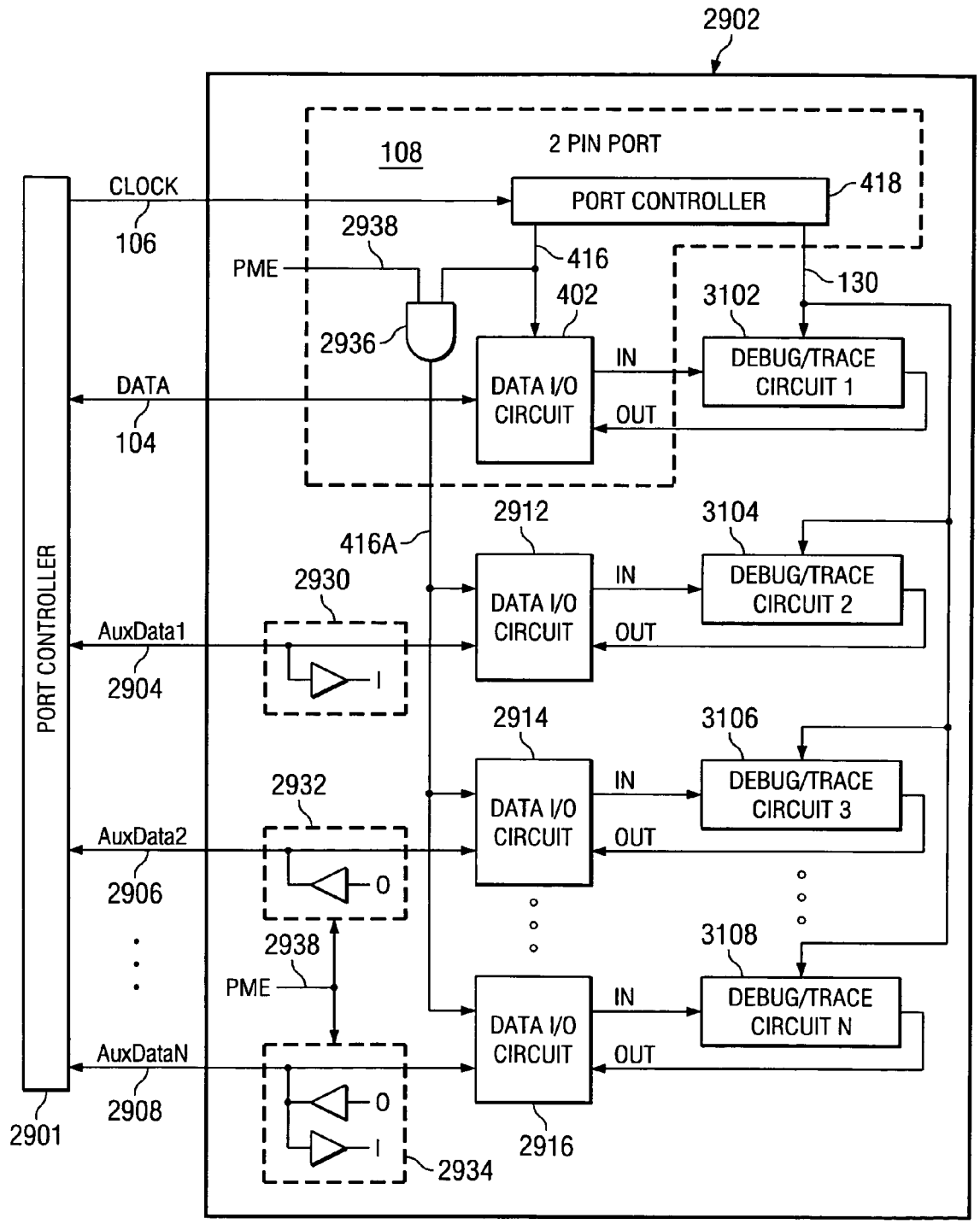
FIG. 31 illustrates the IC or core device wherein the data circuits of FIG. 30 selected by an instruction for a parallel data I/O operation are circuits 1-N used for debug or trace operations.

FIG. 31 illustrates the IC or core device 2902 wherein the data circuits 3002-3008 of FIG. 30 selected by an instruction for a parallel data I/O operation are circuits 3102-3108 1-N used for debug or trace operations. Debug circuits are internal circuits of a device used to detect operational problems in the device's functional hardware or software design. Trace circuits are internal circuits of a device used to monitor the signal activity of the device during its normal operation mode. As with the scan register example of FIG. 30, the present invention enables data access to each debug or trace circuit 1-N using only a single data signal 104, 2904-2908, which advantageously reduces the number of connections required between the debug/trace controller (port controller 2901) and the device.

Figure 32:
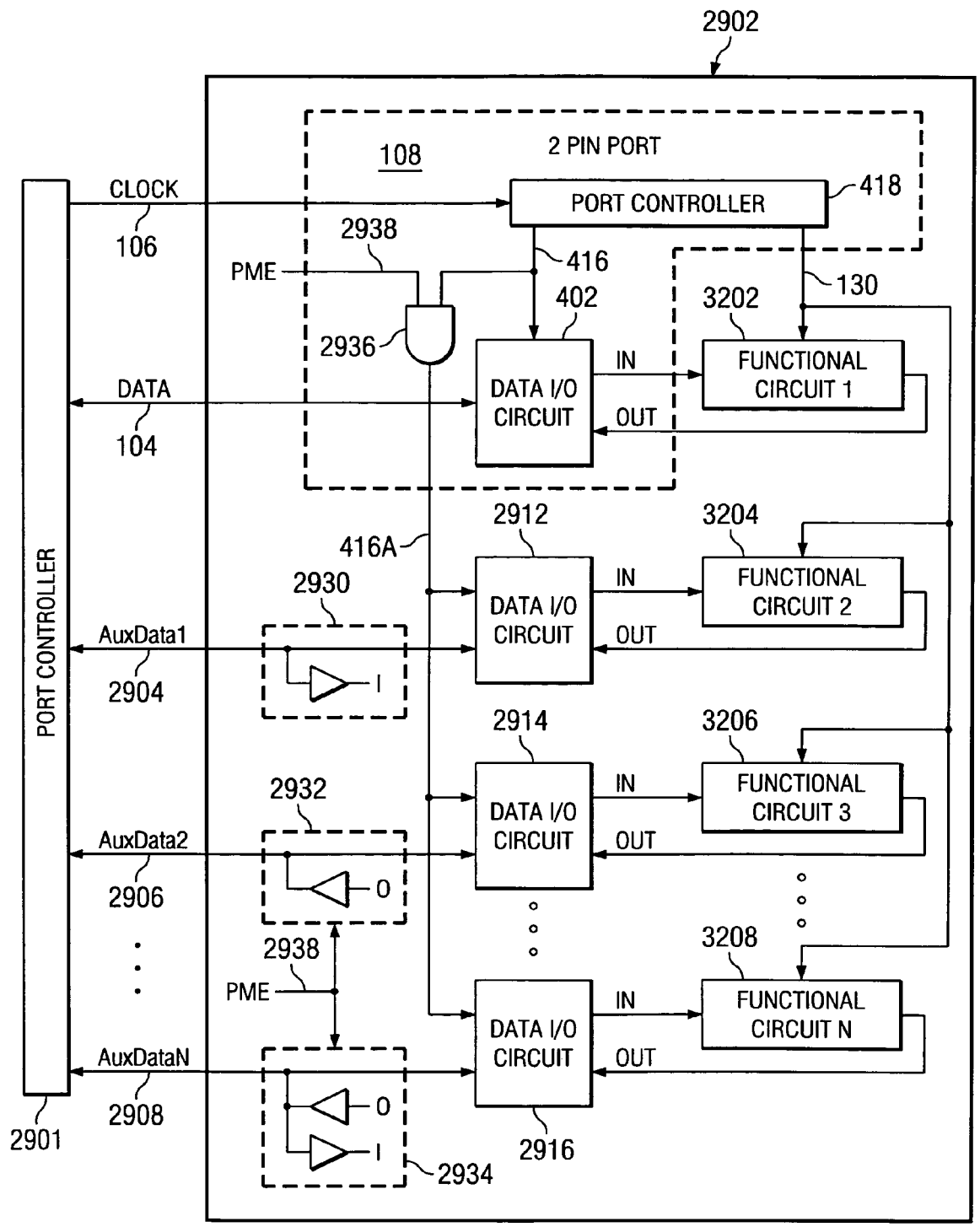
FIG. 32 illustrates the IC or core device wherein the data circuits selected by an instruction for a parallel data I/O operation are functional circuits 1-N of the device.

FIG. 32 illustrates the IC or core device 2902 wherein the data circuits 3202-3208 selected by an instruction for a parallel data I/O operation are functional circuits 1-N of the device. The function circuits utilize the parallel data I/O operation for communicating functional data to and from a functional I/O controller (port controller 2901). As with the examples of FIGS. 30 and 31, the present invention enables data access to each functional circuit 1-N using only a single data signal 104, 2904-2908, which advantageously reduces the number of functional connections required between the functional controller and the device.

I claim:

1. An integrated circuit comprising:
   A. functional circuits having inputs and outputs;
   B. data I/O circuitry having one bi-directional data signal lead that is accessible from outside the integrated circuit, a data input lead that is separate from the bi-directional data signal lead and that is coupled to the one bi-directional data signal lead, and a data output lead that is separate from the bi-directional data signal lead and the data input lead, and that is coupled to the one bi-directional data signal lead;
   C. a clock input lead;
   D. data circuitry having an input connected to the data input lead, an output connected to the data output lead, control inputs, outputs connected with the inputs of the functional circuits, and inputs connected with the outputs of the functional circuits;
   E. instruction circuitry having an input connected to the data input lead, control inputs, and a control output;
   F. address circuitry having an input connected to the data input lead, control inputs, and a control output; and
   G. port controller circuitry having a clock input connected to the clock input lead, a data input connected to the data input lead, a data control output connected to the control input of the data circuitry, an instruction control output connected to the control input of the instruction circuitry, an instruction control input connected to the control output of the instruction circuitry, an address control output connected to the control input of the address circuitry, and an address control input connected to the control output of the address circuitry.

2. The integrated circuit of claim 1 in which the control inputs of the data circuitry include an update input, a capture input, and a clock input.

3. The integrated circuit of claim 1 in which the control inputs of the instruction circuitry include an update input, and a clock input.

4. The integrated circuit of claim 1 in which the data circuitry outputs that are connected with the inputs of the functional circuits carry stimulus data.

5. The integrated circuit of claim 1 in which the data circuitry inputs that are connected with the outputs of the functional circuits carry response data.

* * * * *